United States Patent
Kataoka et al.

(10) Patent No.: US 9,577,666 B2
(45) Date of Patent: *Feb. 21, 2017

(54) METHOD AND SYSTEM

(71) Applicant: FUJITSU LIMITED, Kawasaki-shi, Kanagawa (JP)

(72) Inventors: Masahiro Kataoka, Tama (JP); Ryo Matsumura, Numazu (JP); Takafumi Ohta, Shinagawa (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/180,659

(22) Filed: Jun. 13, 2016

(65) Prior Publication Data

US 2016/0294411 A1 Oct. 6, 2016

Related U.S. Application Data

(63) Continuation of application No. 14/741,936, filed on Jun. 17, 2015, now Pat. No. 9,391,636, which is a
(Continued)

(51) Int. Cl.
*H03M 7/34* (2006.01)
*H03M 7/30* (2006.01)

(52) U.S. Cl.
CPC ......... *H03M 7/3086* (2013.01); *H03M 7/3088* (2013.01); *H03M 7/60* (2013.01)

(58) Field of Classification Search
CPC . H03M 7/3088; H03M 7/3086; H03M 7/3084
(Continued)

(56) References Cited

U.S. PATENT DOCUMENTS

| 5,612,693 A | 3/1997 | Craft et al. |
| 5,764,167 A * | 6/1998 | Adams ................... H03M 7/46 341/63 |

(Continued)

FOREIGN PATENT DOCUMENTS

| JP | 5-46358 | 2/1993 |
| JP | 5-127865 | 5/1993 |

(Continued)

OTHER PUBLICATIONS

Notice of Allowance mailed Mar. 15, 2016 in related U.S. Appl. No. 14/741,936.

(Continued)

*Primary Examiner* — Linh Nguyen
(74) *Attorney, Agent, or Firm* — Staas & Halsey LLP

(57) ABSTRACT

A method includes: setting a first and a second storage regions; first creating a first compression code of a compression target data in a file using a identifier indicating the data in the first storage region when a predetermined first consistency between the compression target data and the data in the first storage region is detected; comparing the compression target data with data in the second storage region when the predetermined first consistency between the compression target data and the data in the first storage region is not detected, the compression target data being moved to the second storage region after the comparing; and storing the compression target data into the first storage region associated with a identifier indicating the data in the first storage region when a predetermined second consistency between the compression target data and the data in the second storage region is detected.

10 Claims, 23 Drawing Sheets

Related U.S. Application Data continuation of application No. PCT/JP2012/008143, filed on Dec. 19, 2012.

(58) Field of Classification Search
USPC .................................... 341/50, 51, 63, 106
See application file for complete search history.

(56) References Cited

U.S. PATENT DOCUMENTS

| | | | |
|---|---|---|---|
| 5,861,827 A * | 1/1999 | Welch | H03M 7/46 341/51 |
| 5,889,481 A | 3/1999 | Okada | |
| 6,188,333 B1 * | 2/2001 | Cooper | G06T 9/005 341/51 |
| 6,292,115 B1 | 9/2001 | Heath | |
| 6,307,488 B1 * | 10/2001 | Cooper | G06T 9/005 341/51 |
| 6,426,711 B1 * | 7/2002 | Cooper | G06T 9/005 341/106 |
| 6,466,144 B1 * | 10/2002 | Cooper | H03M 7/3088 341/106 |
| 7,114,027 B2 * | 9/2006 | Gilfix | G06F 17/30982 707/999.003 |
| 7,117,204 B2 | 10/2006 | Gilfix et al. | |
| 9,391,636 B2 * | 7/2016 | Kataoka | H03M 7/3086 |
| 2002/0175840 A1 | 11/2002 | Kugai | |
| 2002/0196166 A1 | 12/2002 | Satoh et al. | |
| 2003/0025621 A1 | 2/2003 | Christoffersson et al. | |
| 2007/0002855 A1 | 1/2007 | Pessi | |
| 2008/0147801 A1 | 6/2008 | Foti | |
| 2009/0002207 A1 | 1/2009 | Harada et al. | |

FOREIGN PATENT DOCUMENTS

| | | |
|---|---|---|
| JP | 5-233312 | 9/1993 |
| JP | 5-241777 | 9/1993 |
| JP | 6-28149 | 2/1994 |
| JP | 7-64765 | 3/1995 |
| JP | 7-124561 | 5/1995 |
| JP | 7-152533 | 6/1995 |
| JP | 8-69476 | 3/1996 |
| JP | 8-234959 | 9/1996 |
| JP | 9-218867 | 8/1997 |
| JP | 2000-82967 | 3/2000 |
| JP | 2001-44850 | 2/2001 |
| JP | 2005-269184 | 9/2005 |

OTHER PUBLICATIONS

Office Action mailed Feb. 3, 2016 in related U.S. Appl. No. 14/741,936.

International Search Report and Written Opinion mailed Mar. 26, 2013 in related International Application No. PCT/JP2012/008143.

Yuta Noguchi et al., "Data Compression Method by Using Multiple Dictionaries and Its Error Recovery Method", IEICE Technical Report, vol. 106, No. 402, pp. 35-40, Dec. 1, 2006.

Ken-ichi Iwata et al., "Proposal of Partially Decodable Ziv-Lempel Code", IEICE Technical Report, vol. 94, No. 483, pp. 49-54, Jan. 30, 1995.

U.S. Appl. No. 14/741,936, filed Jun. 17, 2015, Masahiro Kataoka, Fujitsu Limited.

* cited by examiner

FIG. 13

| COMPRESSED CODE (REGISTRATION NUMBER) | DATA (CHARACTER INFORMATION) T2 |
|---|---|
| 00000000 | about |
| 00000001 | horse |
| 00000010 | race |
| ⋮ | ⋮ |
| 10110111 | on the other hand |
| ⋮ | ⋮ |
| 1110001 | <br> |
| ⋮ | ⋮ |

METHOD AND SYSTEM

CROSS-REFERENCE TO RELATED APPLICATION

This application is a continuation of U.S. application Ser. No. 14/741,936, filed Jun. 17, 2015, which is a continuation of International Application PCT/JP2012/008143 filed on Dec. 19, 2012 and designated the U.S., the entire contents of which are incorporated herein by reference.

FIELD

The embodiment discussed herein is related to a compression technology and a decompression technology for data.

BACKGROUND

A compression algorithm called LZ77 is known. LZ77 is adopted in compression file formats such as ZIP.

In LZ77, a compression process for data in a file is executed sequentially from the beginning of a compression target file. In LZ77, a data reference region (referred to as a slide window or the like) is set and data subjected to the compression process in the compression target file is stored sequentially in the slide window. The size of the slide window is set in advance. When the size of the data stored in the slide window exceeds the size of the slide window, the data is stored while the data stored beforehand in the slide window is updated.

In the compression process executed sequentially in LZ77, compressed codes are used which are generated based on a data string (longest matching data string) which matches longest piece of data to be executed in the compression process in the compression target file in the data included in the slide window. The compressed codes are information in which a matching length of the longest matching data string of the slide window and a position in the slide window are combined.

According to LZ77, as the matching length of the longest matching data string is longer, considerable data is expressed by one compressed code (a combination of the matching length and the position), thereby improving a compression ratio. When the longest matching data string of the matching length is considerably extracted from the compression target file, the compression ratio is improved. Therefore, there is a tendency to improve the compression ratio when the size of the slide window increases. This is because a probability of specifying the data string of which the matching length is long is improved since data matching processing target data is found from more data in the compression target file.

In a decompression process, decompression is performed with reference to a slide window for each compressed code that is sequentially read from the head of a compressed file, and data in the slide window is updated based on the decompressed data. Based on the data in the slide window, which is thus sequentially updated, the compressed code is decompressed.

As an example in the related art, Japanese Laid-open Patent Publication No. 5-241777 is known.

SUMMARY

According to an aspect of the invention, a method includes first setting a first storage region and a second storage region in a memory; first comparing, by a first processor, a compression target data in a file with data in the first storage region; first creating, by the first processor, a first compression code of the compression target data using a identifier indicating the data in the first storage region when a predetermined first consistency between the compression target data and the data in the first storage region is detected; second comparing, by the first processor, the compression target data with data in the second storage region when the predetermined first consistency between the compression target data and the data in the first storage region is not detected, the compression target data being moved to the second storage region after the second comparing; and first storing, by the first processor, the compression target data into the first storage region associated with a identifier indicating the data in the first storage region when a predetermined second consistency between the compression target data and the data in the second storage region is detected.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 13 illustrates another compression dictionary table T2;

DESCRIPTION OF EMBODIMENT

According to LZ77, compressed data is generated by using a slide window, which is dynamically updated, in a compression process, and data that is restored in the slide window by decompressing the compressed data from a head of a compressed file is used in a decompression process. In a case where it is desirable to obtain a part of the compressed data, the decompression process is performed from the top of the compressed data instead of performing a partial decompression process on the compressed data, and it takes a long time to perform the decompression.

According to an aspect, an object of the embodiment is to provide compressed data that may be partially decompressed by using a compressed code based on a longest matching data string.

Hereinafter, a description will be given of the embodiment with reference to drawings.

Figure 1:
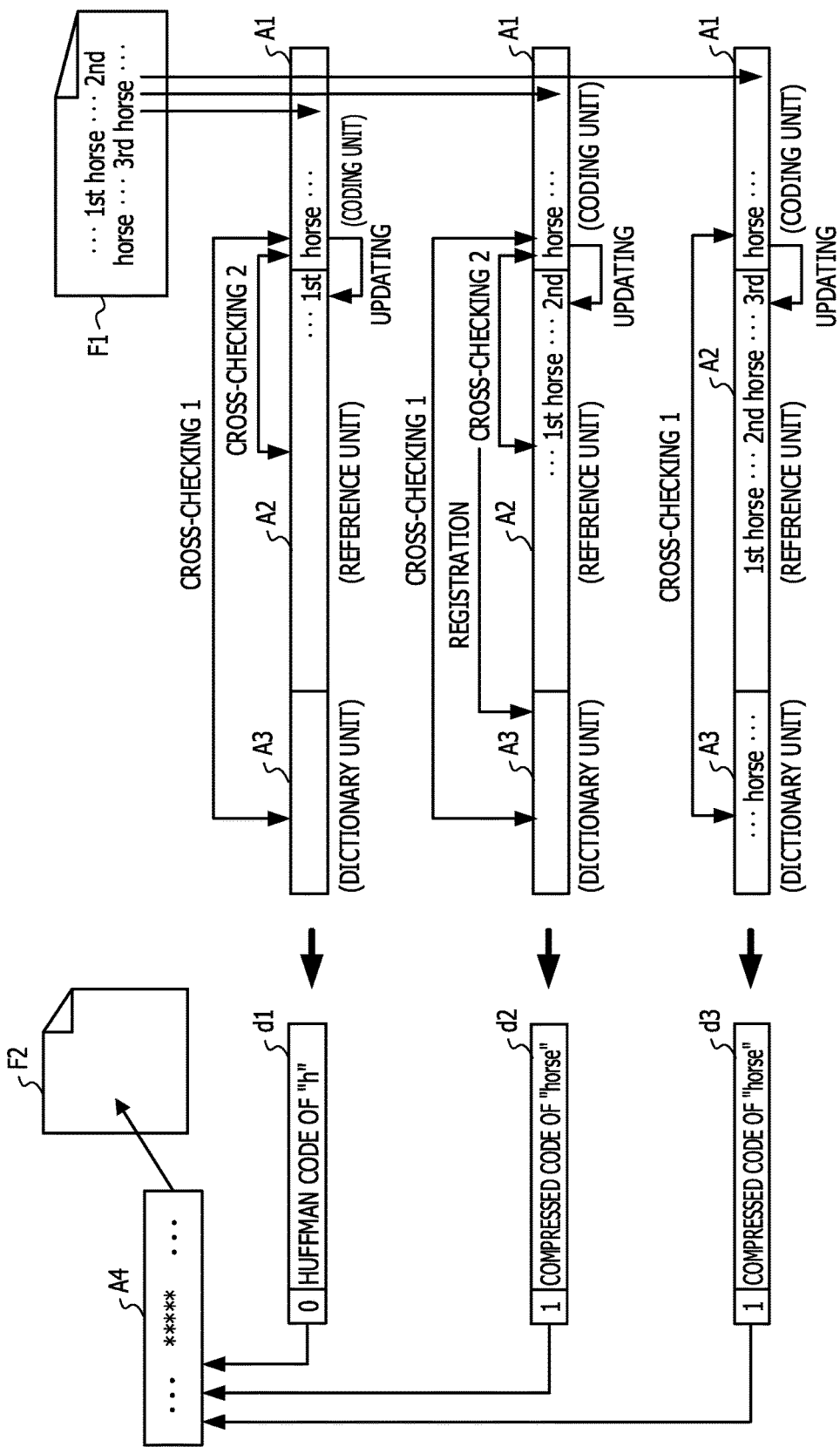
FIG. 1 illustrates an exemplary flow of a compression process.

FIG. 1 illustrates an exemplary flow of the compression process. As work areas of the compression process, a storage region A1, a storage region A2, a storage region A3, and a storage region A4 are provided in a memory. A file F1 as a target of compression is loaded on the storage region A1, the pre-loaded data is sequentially read, and generation of compressed data ("cross-checking 1" and the like in FIG. 1) and updating of the storage region A2 ("updating" and the like in FIG. 1) are performed based on the read data as a target of processing. The generated compressed data is sequentially stored on the storage region A4, and a compressed file F2 is output based on the compressed data that is stored on the storage region A4. A compression dictionary is stored on the storage region A3, and the data as a target of processing is registered in the compression dictionary ("registration in FIG. 1) in accordance with a result of cross-checking the data that is stored on the storage region A2 and the data as a target of processing ("cross-checking 2" and the like in FIG. 1). For example, if the length of a longest matching data string that is acquired in the cross-checking 2 is equal to or greater than a predetermined length Lmin, the longest matching data string is registered in the compression dictionary. The storage region A1, the storage region A2, and the storage region A3 are referred to as a coding unit, a reference unit, and a dictionary unit, respectively. As compressed data, a compressed code that is registered in the compression dictionary of this compression algorithm or a Huffman code that is acquired by Huffman-coding the data as a target of processing is used in accordance with the result of the cross-checking 1, for example. In addition, the data itself as a target of processing or a compressed code that is generated by another compression algorithm may be used instead of the Huffman code.

Figure 2:
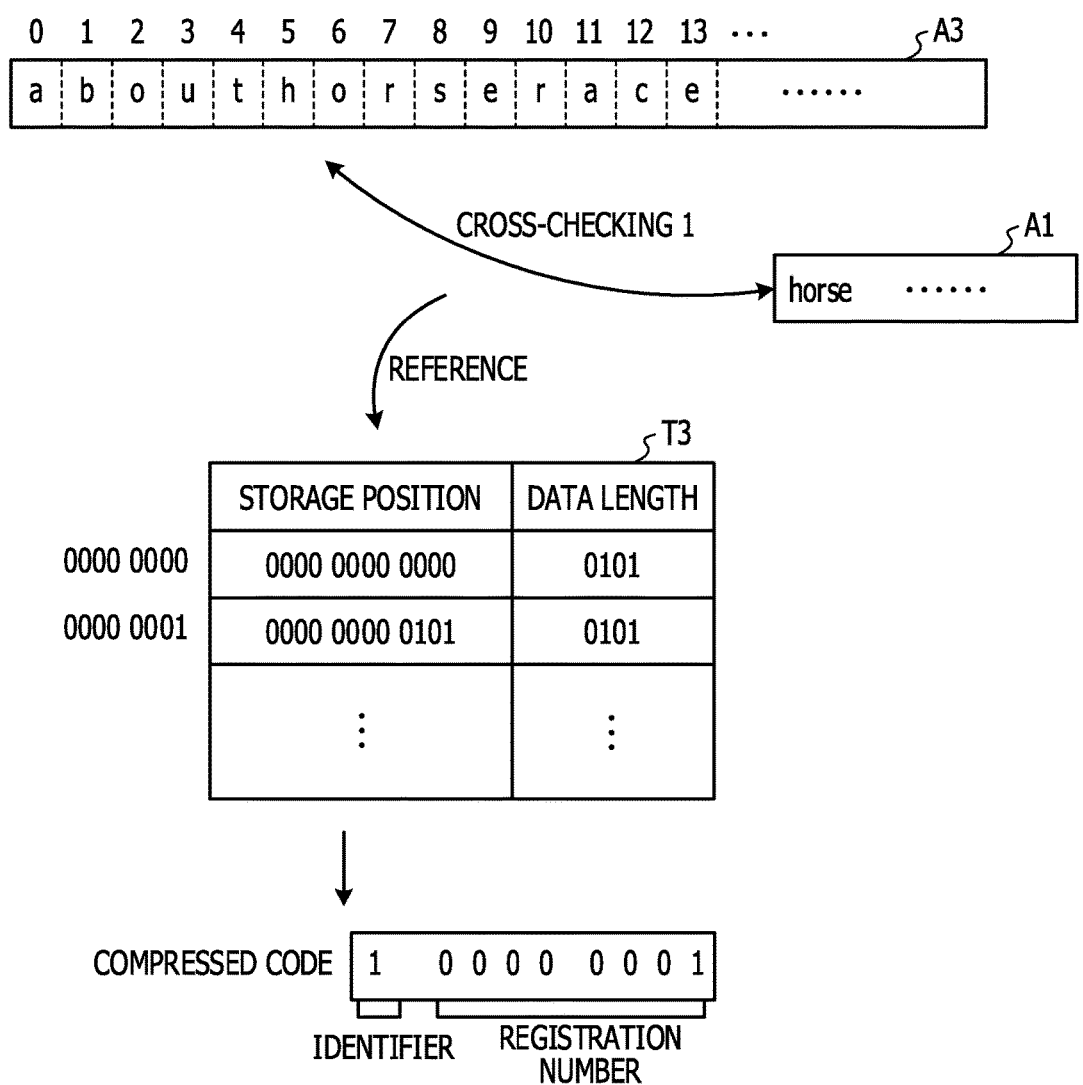
FIG. 2 illustrates an exemplary compression dictionary.

FIG. 2 illustrates an exemplary compression dictionary. The compression dictionary illustrated in FIG. 2 is configured of the storage region A3 and a reference table T3. In the reference table T3, longest matching data strings are sequentially stored on the storage region A3 by the "registration" in FIG. 1. Every time a longest matching data string is registered, a storage position of the longest matching data string in the storage region A3 and the length of the longest matching data string are stored in the reference table T3. A registration number that indicates a position in the reference table T3, in which the storage position and the length of the longest matching data string are registered, is used as a compressed code corresponding to the longest matching data string. The data in the storage region A3 and the data as a target of processing are cross-checked in the "cross-checking 1" in FIG. 1, and if data that coincides with the data as a target of processing is acquired as a result of the cross-checking, a compressed code that is associated, in the reference table T3, with the position of the coincident data in the storage region A3 and the length of the data is generated.

In the example illustrated in FIG. 1, data of character sequences " . . . 1st horse . . . 2nd horse . . . 3rd horse . . . " is included in the file F1 (" . . . " represent an unspecified character sequence). The file F1 is loaded on the storage region A1, and the data in the loaded file F1 is sequentially read. Hereinafter, a description will be given of the flows of generation processing of compressed data d1 to d3, which are illustrated in FIG. 1.

If "h" and the following part in "1st horse . . . " are data as a target of processing (a position, from which the data is read, in the storage region A1 is a position of "h" in "1st horse"), a longest matching data string of "horse . . . " is searched in the storage region A3. If the data as a target of processing is "h" and the following part in "1st horse . . . ", no data is stored on the storage region A3 as illustrated in FIG. 1. Therefore, data that coincides with "h" as head data is not present. For this reason, a longest matching data string with a length that is equal to or greater than the predetermined length Lmin is not obtained, and the "cross-checking 2" as processing of cross-checking the data as a target of processing with the data to be stored on the storage region A2 is thus performed. In the "cross-checking 2", the respective data that is stored on the storage region A2 and "h" as a head of the data as a target of processing are cross-checked. However, data that coincides with "h" is still not present in the storage region A2. Therefore, a longest matching data string with a length that is equal to or greater than the predetermined length Lmin is not present, and Huffman coding of the head data "h" of the data as a target of processing is thus performed. The compressed data d1 in the case in which "h" and the following part in "1st horse" are data as a target of processing, the compressed code that is acquired by the Huffman coding and an identifier ("0" in the example illustrated in FIG. 1) that indicates that the compressed code has been generated by the Huffman coding are included. As described above, the portion of the compressed code that is included in the compressed data d1 may be a compressed code based on another compression algorithm or may be the head data ("h") itself of the data as a target of processing. The generated compressed data d1 is written in the storage region A4. Furthermore, the processing has been performed on the head data ("h") of the data as a target of processing and "h" is stored on the storage region A2 ("updating" in FIG. 1).

If "h" and the following part in "2nd horse" are data as a target of processing (the position, from which the data is read, in the storage region A1 is the position of "h" in "2nd horse"), a longest matching data string of "horse . . . " is searched in the storage region A3. Since no data is stored on the storage region A3 as illustrated in FIG. 1, data that coincides with "h" as the head data is not present. That is, since a longest matching data string with a length that is equal to or greater than the predetermined length Lmin is not acquired in the "cross-checking 1", the longest matching data string of "horse . . . " is further searched in the storage region A2 (cross-checking 2). " . . . 1st horse . . . " is already stored on the storage region A2. For example, "h" is searched in the storage region A2, and cross-checking is sequentially performed in order to determine whether or not "o", "r", "s", "e" . . . follow "h" in the storage region A2, which is obtained by the searching. In the example illustrated in FIG. 1, the data "horse . . . " as a target of processing coincides with the part "horse" in " . . . 1st horse . . . " stored on the storage region A2. FIG. 1 illustrates an exemplary case in which the coincident part "horse" corresponds to the longest matching data string and the matching length is equal to or greater than the predetermined length Lmin. In the case in which the longest matching data string "horse" has a length that is equal to or greater than the predetermined length Lmin as illustrated in FIG. 1, "horse" is registered in the storage region A3. In addition, a compressed code is generated based on the content that is registered in the compression dictionary. The generated compressed code indicates a storage position in the compression dictionary and a data length of the registered longest matching data string. The compressed data d2 in a case where "h" and the following part in "2nd horse . . . " are data as a target of processing includes the generated compressed code and an identifier ("1" in the example illustrated in FIG. 1) that indicates that the compressed code has been generated based on the compression dictionary. The generated compressed data d2 is stored on the storage region A4. Furthermore, since the processing has been performed on the longest matching data string "horse" obtained by the "cross-checking 2", "horse" is stored on the storage region A2 ("updating" in FIG. 1).

If "h" and the following part in "3rd horse . . . " are data as a target of processing, a longest matching data string "horse" is searched in the storage region A3 ("cross-checking 1"). As illustrated in FIG. 1, "horse" has already been stored on the storage region A3. For example, "h" is searched in the storage region A3 first, and cross-checking is sequentially performed in order to determine whether or not "o", "r", "s", "e" . . . follow "h" in the storage region A3, which is obtained by the searching. In the example illustrated in FIG. 1, the data string "horse" coincides in the cross-checking 1. FIG. 1 illustrates an exemplary case in which the coincident part "horse" corresponds to the longest matching data string and the matching length is equal to or greater than the predetermined length Lmin. In the case in which the longest matching data string "horse" has a length that is equal to or greater than the predetermined length Lmin as illustrated in FIG. 1, a registration number corresponding to the storage position in the storage region A3 and the matching length is obtained from the reference table T3. The compressed data d3 in a case where "h" and the following part in "3rd horse . . . " are the data as a target of processing includes the acquired registration number as a compressed code and further includes an identifier ("1" in the example illustrated in FIG. 1) that indicates that the compressed code has been generated based on the compression dictionary (the storage region A3 and the reference table T3). Furthermore, since the processing has been performed on the longest matching data string "horse" obtained by the "cross-checking 1", "horse" is stored on the storage region A2 ("updating in FIG. 1).

According to a modification example of the compression process illustrated in FIG. 1, the "updating" in FIG. 1 is not performed when compressed data with an identifier "1", such as the compressed data d2 or the compressed data d3, has been generated, and the "updating" is performed only when compressed data with an identifier "0", such as the compressed data d1, has been generated, for example.

Information about positions, which are used for access during the compression process in the storage regions A1 to A4 is also managed. Although the management of the position information will be described later, a data reading position in the storage region A1, a data updating position and a data reference position in the storage region A2, a registration position and a data reference position in the storage region A3, and further, a data writing position in the storage region A4, for example, are managed.

Figure 3:
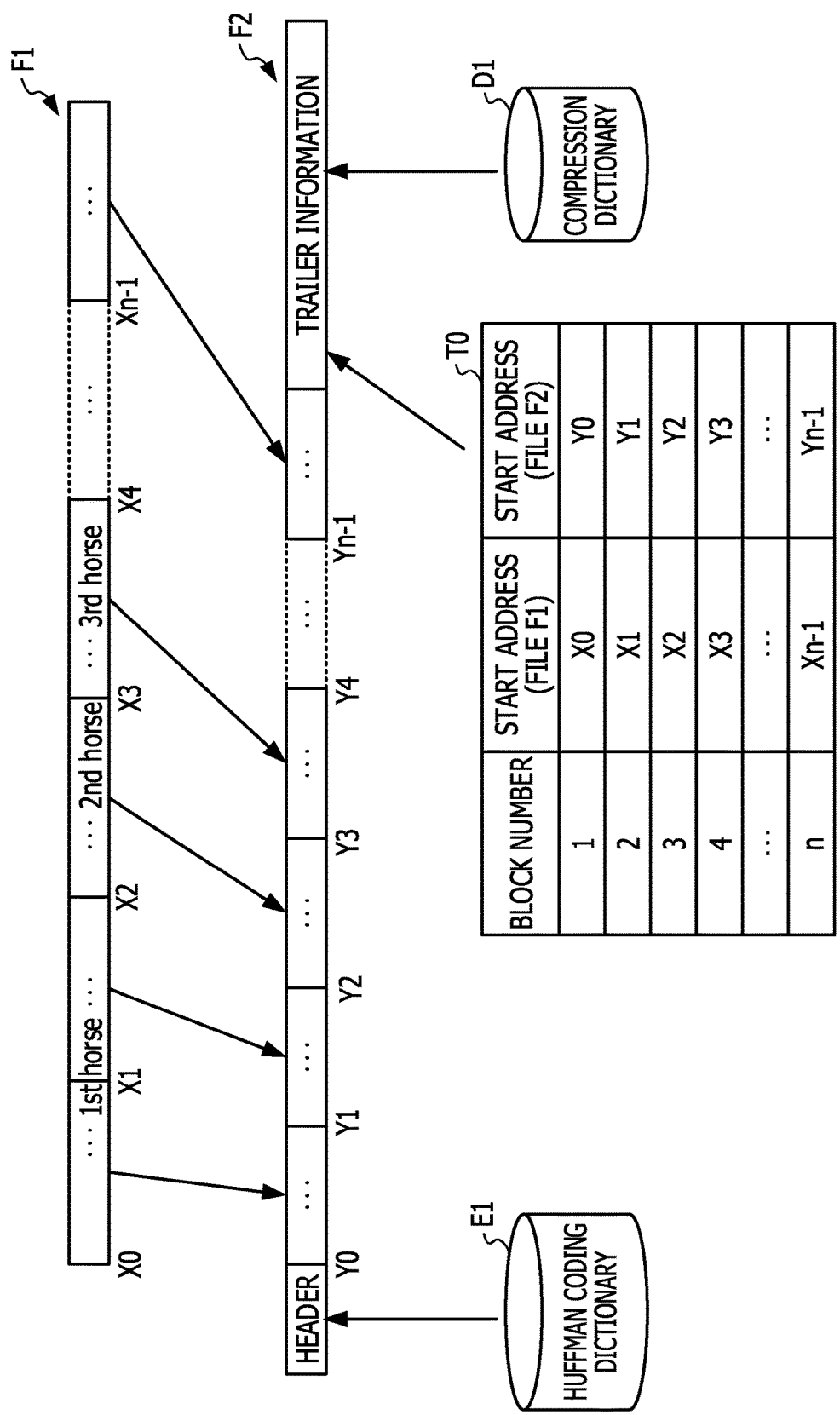
FIG. 3 illustrates an exemplary block configuration of a compressed file.

The storage region A2 and the storage region A3 are respectively storage regions with determined data sizes, for example. The data sizes are from several kilobytes to several tens of kilobytes, for example. If data with a data size that is equal to or greater than the predetermined data size is stored on the storage region A2, for example, old data that is stored at the head of the storage region A2 is rewritten with the new data. The position of the data to be stored on the storage region A2 is indicated by an address relative to a writing position that is updated in response to the storage of data, for example. In addition, the address relative to the writing position indicates an order representing which of the data stored on the storage region A2 has been stored earlier or later. The storage region A3 is a storage region with a predetermined data size in accordance with a size of an input file, for example. The data size is from several kilobytes to several tens of kilobytes, for example. If data with a data size that is equal to or greater than the predetermined data size is stored thereon, the storage of the new data is inhibited. FIG. 3 illustrates an exemplary block configuration of a compressed file. In FIG. 3, a file F1 is divided into n blocks. The blocks may be obtained by dividing the file F1 into data with a predetermined size or may be obtained by dividing the file F1 based on section designation (for example, a tag in an HTML document (such as <h1> or <p>)) included in the file F1. For example, address information (X0 to Xn−1) that indicates a start position of each block in the file F1 and address information (Y0 to Yn−1) that indicates a start position of each compressed block in the compressed file F2 are associated with a block number of each block and stored on a management table T0. The management table T0 is included in trailer information of the compressed file F2 and is referred to when partial decompression of the compressed file F2 is performed. In addition, the compressed file F2 includes a coding dictionary E1 of the Huffman code that has been used for generating the compressed file F2, for example, and includes the compression dictionary in the trailer information.

The compression dictionary included in the trailer information after completion of the compression process (at the timing of S111 in FIG. 7 which will be described later, for example) is stored. Header information includes information for identifying the compression algorithm that has been used for generating the compressed file F2 and information of a parameter that has been used for the compression, for example. In addition, header information included in the compressed file F2 and information indicating the ranges of the compressed data and the trailer information are included.

According to a modification example of the compression process, the compression dictionary may be generated for each block. In such a case, identification information (a dictionary number in FIG. 1) of the compression dictionary that is generated for each block is associated with the block number of each block and is stored on the management table T0.

According to the compression process illustrated in FIG. 1, the longest matching data string that is extracted by searching for the longest matching data string is registered in the compression dictionary. Furthermore, since the compressed code corresponding to the data string that has been registered in the compression dictionary does not change, it is possible to commonly use the compressed code at any positions in the file F1. Therefore, the data does not have to be restored in the slide window of LZ77, and it is possible to perform partial decompression by the combination with the address information of the block. In addition, usage of the reference table T3 makes it possible to configure the compressed code by one type of information, namely the registration number instead of two types of information, namely the storage position and the length of the longest matching data string and to thereby improve the efficiency of compression.

As described above, the compression using the compression dictionary which fixes the correspondence between the data string and the compressed code by the cross-checking between data strings in the file enables efficient compression (while maintaining a compression rate) of the file in which a long data string repeatedly appears and also enables partial decompression. In addition, the generation of the compression dictionary and the compression process are performed by reading data once from the file F1. For this reason, memory access is suppressed as compared with a case in which the compression dictionary is generated and the compression process is then performed based on the compression dictionary.

Figure 4:
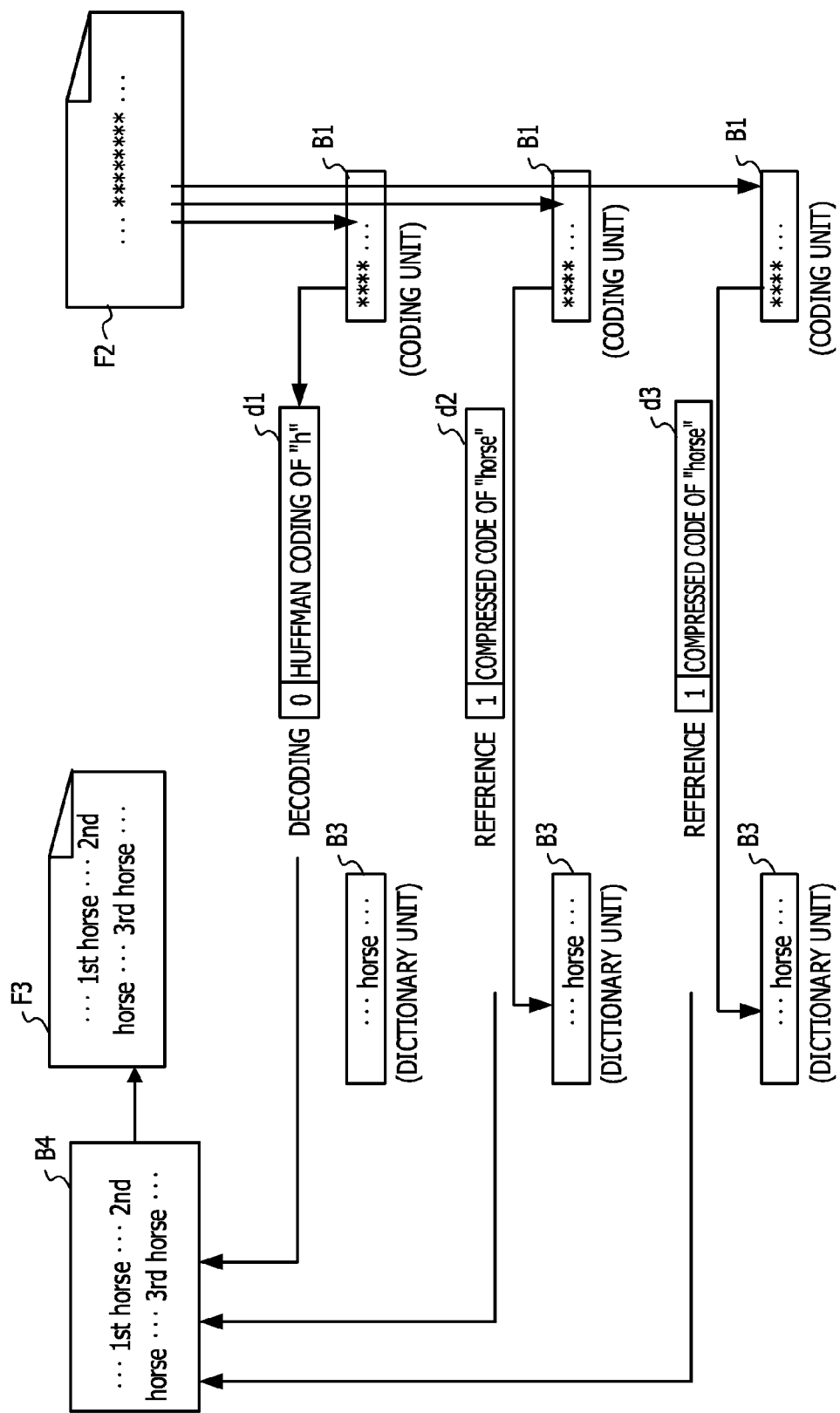
FIG. 4 illustrates an exemplary flow of a decompression process.

FIG. 4 illustrates an exemplary flow of a decompression process. As work areas for the decompression process, a storage region B1, a storage region B3, and a storage region B4 are provided in the memory. Compressed data is sequentially read from a content part of the compressed file F2 that is loaded on the storage region B1, and decompressed data is generated based on the read compressed data as a target of processing. At this time, generation processing in accordance with an identifier that is included in the compressed data is performed. The generated decompressed data is sequentially stored on the storage region B4, and an decompressed file F3 is generated based on the decompressed data that is stored on the storage region B4. In addition, the compression dictionary that is included in the compressed file F2 is loaded on the storage region B3. The storage region B1 and the storage region B3 are referred to as a coding unit and a dictionary unit, respectively. Hereinafter, a description will be given of the decompression process of the respective compressed data d1 to d3 illustrated in FIG. 4.

If compressed data as a target of processing is the compressed data d1 (the compressed data d1 is present at the reading position in the storage region B1), an identifier of the compressed data d1 is determined first. Since the identifier of the compressed data d1 indicates compression by the Huffman coding (the identifier is "0"), the compressed data d1 is decoded based on the Huffman coding algorithm.

If compressed data as a target of processing is the compressed data d2 (the compressed data d2 is present at the reading position in the storage region B1), an identifier of the compressed data d2 is determined first. Since the identifier of the compressed data d2 indicates compression by the compression dictionary (the identifier is "1"), the compression dictionary is referred to based on the compressed code in the compressed data d2. Specifically, designation of the position and the length in the storage region B3 that correspond to the compressed code is read from the reference table T3 that is included in the compression dictionary, and data in accordance with the designation is read from the storage region B3. The read data corresponds to the decompressed data. Since the compressed code in the compressed data d2 indicates "horse" in the compression dictionary, "horse" is generated as decompressed data.

If compressed data as a target of processing is the compressed data d3 (the compressed data d3 is present at the reading position in the storage region B1), an identifier of the compressed data d3 is determined first. Since the identifier of the compressed data d3 indicates compression by the compression dictionary (the identifier is "1"), the compression dictionary is referred to based on the compressed code in the compressed data d3. Specifically, designation of the position and the length in the storage region B3 that correspond to the compressed code is read from the reference table T3 that is included in the compression dictionary, and data in accordance with the designation is read from the storage region B3. The read data corresponds to the decompressed data. Since the compressed code in the compressed data d3 indicates "horse" in the compression dictionary, "horse" is generated as decompressed data.

Figure 5:
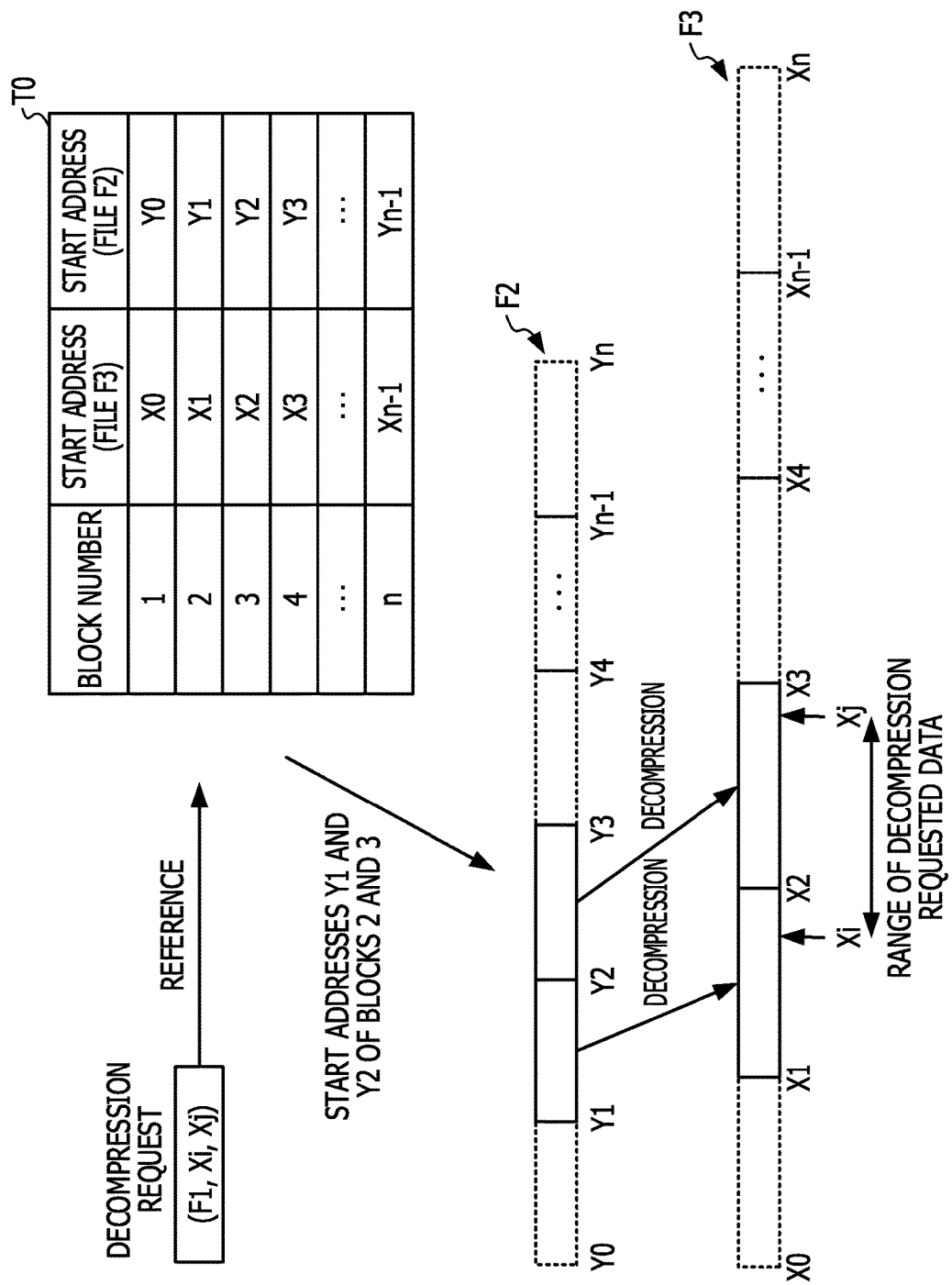
FIG. 5 illustrates an exemplary partial decompression.

FIG. 5 illustrates exemplary partial decompression. If the compressed file F2 is partially decompressed, a range of the decompressed data is designated, for example. By a decompression request that includes designation of a file (file F1) and designation of a start address Xi and an end address Xj of the requested range, the range of the decompressed data is designated. A target file of the partial decompression is determined in response to the designation of the file. In the example illustrated in FIG. 5, the partial decompression process of the compressed file F2 is performed based on the file F1 as an original of the compressed file F2 being designated.

A block to be decompressed is determined based on the range that is designated by the decompression request. In the example illustrated in FIG. 5, the start address Xi is greater than a start address X1 of a block number 2 and is smaller than a start address X2 of a block number 3. In addition, the end address Xj is greater than the start address X2 of the block number 3 and is smaller than a start address X3 of a block number 4. That is, the range designated by the decompression request is included in the block number 2 and the block number 3. Therefore, only the block number 2 and the block number 3 are loaded from the compressed file F2 and are decompressed, thereby generating data in the range of the decompression request.

If compression has been performed by using different compression dictionaries for the respective blocks, dictionary numbers in the management table T0 are referred to in the decompression process of the respective blocks, and decompression is then performed based on the compression dictionaries corresponding to the referred dictionary numbers.

Figure 6:
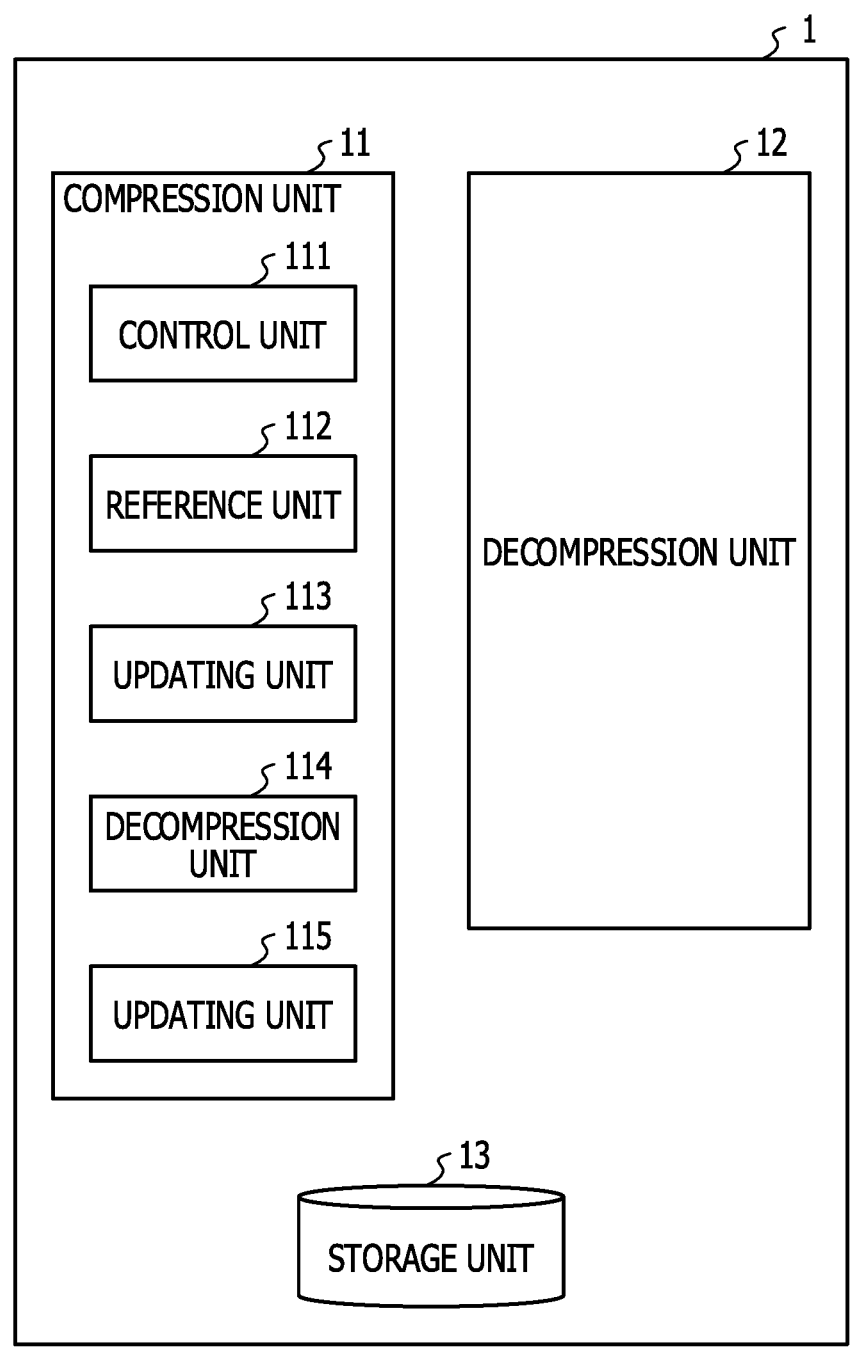
FIG. 6 illustrates an exemplary functional configuration.

FIG. 6 illustrates an exemplary functional configuration. A computer 1 that executes the processing according to the embodiment includes a compression unit 11, a decompression unit 12, and a storage unit 13. The compression unit 11 is for performing the compression process, and the decompression unit 12 is for performing the decompression process. The storage unit 13 is for storing the file F1 as a target of compression, the file F2 that is acquired by the compression process, and the file F3 that is acquired by decompressing the file F2. In addition, the storage unit 13 is used as a work area of the compression unit 11 and the decompression unit 12. The compression unit 11 includes a control unit 111, a reference unit 112, an updating unit 113, a reference unit 114, and an updating unit 115.

The control unit 111 controls the reference unit 112, the updating unit 113, the reference unit 114, and the updating unit 115 to execute the compression process and control execution of processing by the respective functional units. In addition, the control unit 111 secures storage regions (the storage region A1 and the storage region A2 illustrated in FIG. 1, for example) in the storage unit 13 in order to maintain data to be used for the processing by the respective functional units. The reference unit 112 executes processing of referring to data in the storage region A2 based on data as a target of processing in the storage region A1. The reference processing is performed by cross-checking the respective data in the storage region A2 with the data as a target of processing, for example. The updating unit 113 updates the data in the storage region A2 in response to reading of the data as a target of processing from the storage region A1. The reference unit 114 executes the processing of referring to the compression dictionary based on the data as a target of processing. In accordance with a result of the reference of the compression dictionary by the reference unit 114, the control unit 111 generates compressed data. The updating unit 115 updates the compression dictionary in accordance with the result of the reference of the storage region A2 by the reference unit 112. Next, procedures for executing the processing by the respective functional units will be described below.

Figure 7:
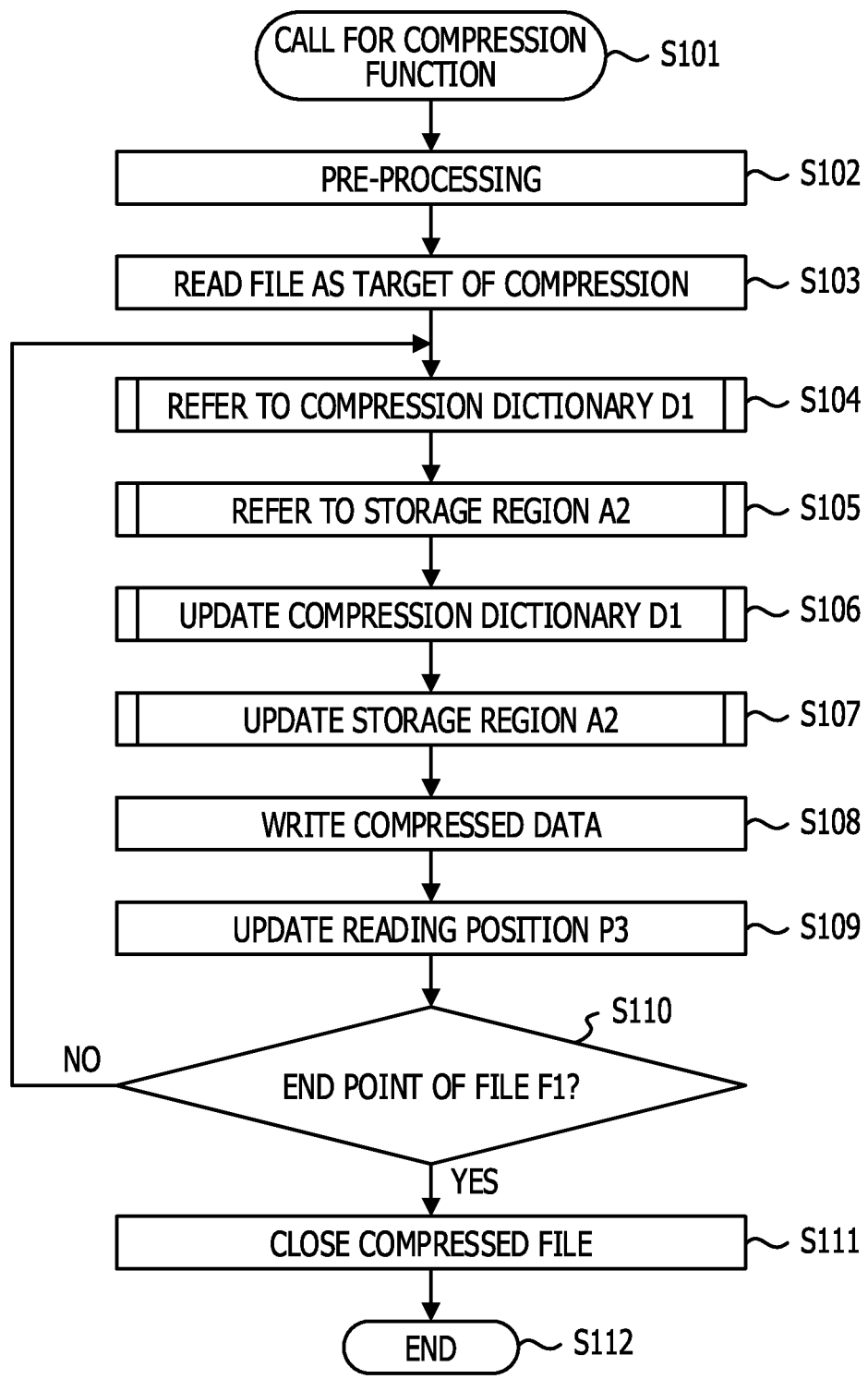
FIG. 7 illustrates an exemplary procedure for the compression process.

FIG. 7 illustrates an exemplary procedure for the compression process. First, if a compression function is called for by an operation of an operating system or an application program in the computer 1 (S101), the control unit 111 executes pre-processing (S102). The pre-processing in S102 includes securing the storage region A1 and the storage region A2 illustrated in FIG. 1, securing the storage region A4 for storing data that has already been compressed, setting position information in the respective storage regions, and securing the storage region of the compression dictionary.

Figure 8:
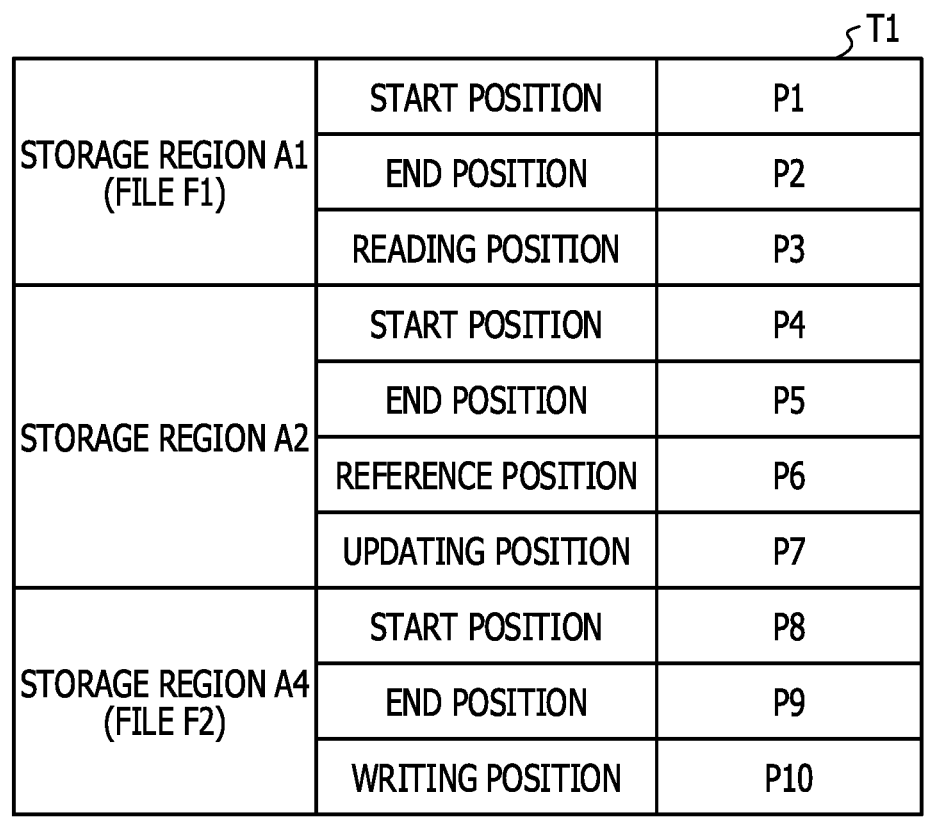
FIG. 8 illustrates an exemplary position information table T1.

FIG. 8 illustrates an exemplary position information table T1. The position information table T1 is used for managing access positions to the respective storage regions (the storage region A1, the storage region A2, the storage region A4, and the like). In the position information table T1, a start position P1, an end position P2, and a reading position P3 of the storage region A1, in which the file F1 is developed, in the storage unit 13 are set. In addition, a start position P4, an end position P5, a reference position P6, and an updating position P7 of the storage region A2 in the storage unit 13 are further set in the position information table T1. A start position P8, an end position P9, and a writing position P10 of the storage region A4 in the storage unit 13 are set in the position information table T1. Initial values of the respective position information that is stored in the position information table T1 are set by the control unit 111 in the pre-processing in S102. For example, an initial value of the reading position P3 is the same as the start position P1, initial values of the reference position P6 and the updating position P7 are also the same as the start position P4, and an initial value of the writing position P10 is also the same as the start position P8.

If the processing in S102 is completed, then the control unit 111 develops the file F1 as a target of compression in the storage region A1 (S103). Next, the control unit 111 causes the reference unit 114 to execute processing of referring to the compression dictionary (S104). The reference unit 114 executes the processing of referring to the compression dictionary based on the data as a target of the processing that starts from the reading position P3 in the storage region A1. The reference processing in S104 will be described later with reference to FIG. 12. By the reference processing in S104, the reference unit 114 returns, to the control unit 111, a compressed code corresponding to the data as a target of processing from the compression dictionary or information that indicates that there is no corresponding compressed code.

Figure 9:
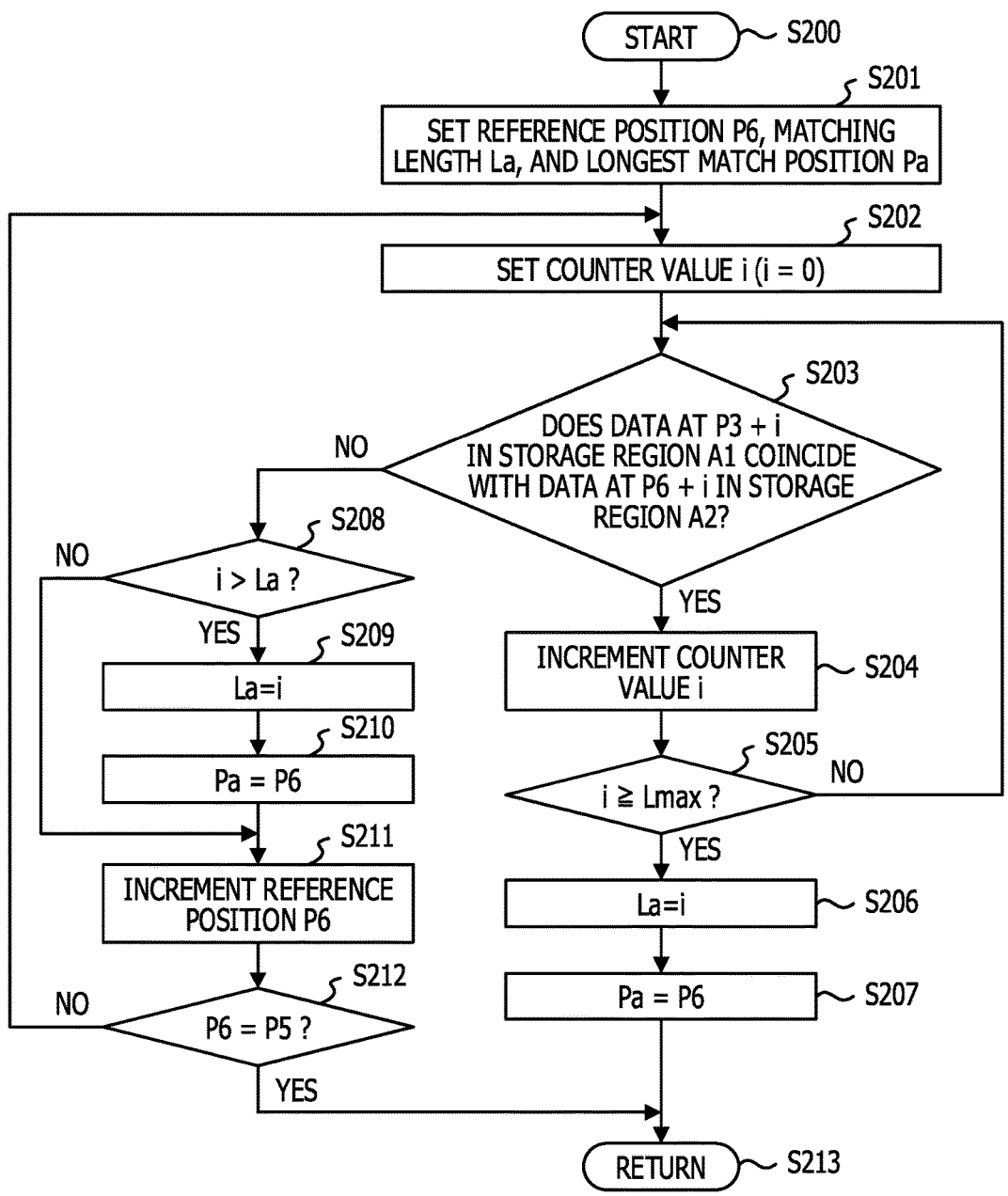
FIG. 9 illustrates an exemplary procedure for processing of referring to a storage region A2.

If the result of reference by the reference unit 114 is returned to the control unit 111, the control unit 111 causes the reference unit 112 to execute the processing of referring to the storage region A2 (S105). The reference unit 112 refers to the storage region A2 based on the data as a target of processing. FIG. 9 illustrates an exemplary procedure for the processing of referring to the storage region A2. If the control unit 111 instructs the reference unit 112 to refer to the storage region A2 (S200), the reference unit 112 sets a reference position P6, a matching length La, and a longest match position Pa of the storage region A2 (sets P6=P1, La=0, and Pa=P1, for example) (S201). The matching length La and the longest match position Pa are stored on the storage unit 13. If the processing in S201 is completed, the reference unit 112 further sets a counter value i (S202). The counter value i is set to "0".

If the processing in S202 is completed, the reference unit 112 cross-checks the data as a target of processing with the data in the storage region A2. In the cross-checking, the reference unit 112 determines whether or not data at a position (P3+i) that deviates from the reading position P3 in the storage region A1 by the counter value i coincides with data at a position (P6+i) that deviates from the reference position P6 in the storage region A2 by the counter value i (S203).

If the reference unit 112 determines in the determination in S203 that the data coincides with each other (S203: YES), the reference unit 112 increments the counter value i (S204). Then, the reference unit 112 determines whether or not the counter value i that has been incremented in S204 is equal to or greater than a set value Lmax (S205). If the counter value i is less than the set value Lmax (S205: NO), the determination in S203 is made again. By the aforementioned processing in S203 to S205, determination is made one by one to in order to recognize whether or not the data (data as a target of processing) from the reading position P3 coincides with the data string from the reference position P6. The counter value i indicates the length of data that coincides with the data as a target of processing. The set value Lmax is a value that is set in advance and indicates the upper limit of the longest mach.

If the counter value i is equal to or greater than the set value Lmax in the determination in S205 (S205: YES), the reference unit 112 updates the matching length La to the counter value i (S206) and updates the longest match position Pa to the reference position P6 (S207). "=" represented in S206 and S207 in FIG. 9 is an assignment operator. The order of the processing in S206 and S207 may be reversed. If the values are updated in S206 and S207, the reference unit 112 returns the matching length La and the longest match position Pa, into which the values are substituted, to the control unit 111 (S213).

If it is determined in the determination in S203 that the data does not coincide each other (S203: NO), the reference unit 112 determines whether or not the counter value i is greater than the matching length La (S208). If the counter value i is greater than the matching length La (S208: YES), the reference unit 112 updates the matching length La to the counter value i (S209) and updates the longest match position Pa to the reference position P6 (S210). "=" represented in S209 and S210 in FIG. 9 is an assignment operator.

The order of the processing in S209 and S210 may be reversed. If the counter value i is equal to or less than the matching length La (S208: NO), or the processing in S206 and S207 has been performed, the reference unit 112 increments the reference position P6 (P211). The reference unit 112 further determines whether or not the reference position P6 has reached the end position P5 in the storage region A2 (S212). If the reference position P6 has not reached the end position P5 (S212: NO), the reference unit 112 resets the counter value i again by the processing in S202 and makes the determination in S203 based on the reference position P6 that has been incremented in S211. If it is determined in the determination in S212 that the reference position P6 has reached the end position P5 (S212: YES), the reference unit 112 returns the matching length La and the longest match position Pa to the control unit 111 and completes the processing of referring to the storage region A2 (S213).

Next, the control unit 111 causes the updating unit 115 to perform the processing of updating the compression dictionary based on the result (the matching length La and the longest match position Pa) of the processing of referring to the storage region A2 in S105 (S106). The updating unit 115 performs the processing of updating the compression dictionary in accordance with the flow illustrated in FIG. 10.

Figure 10:
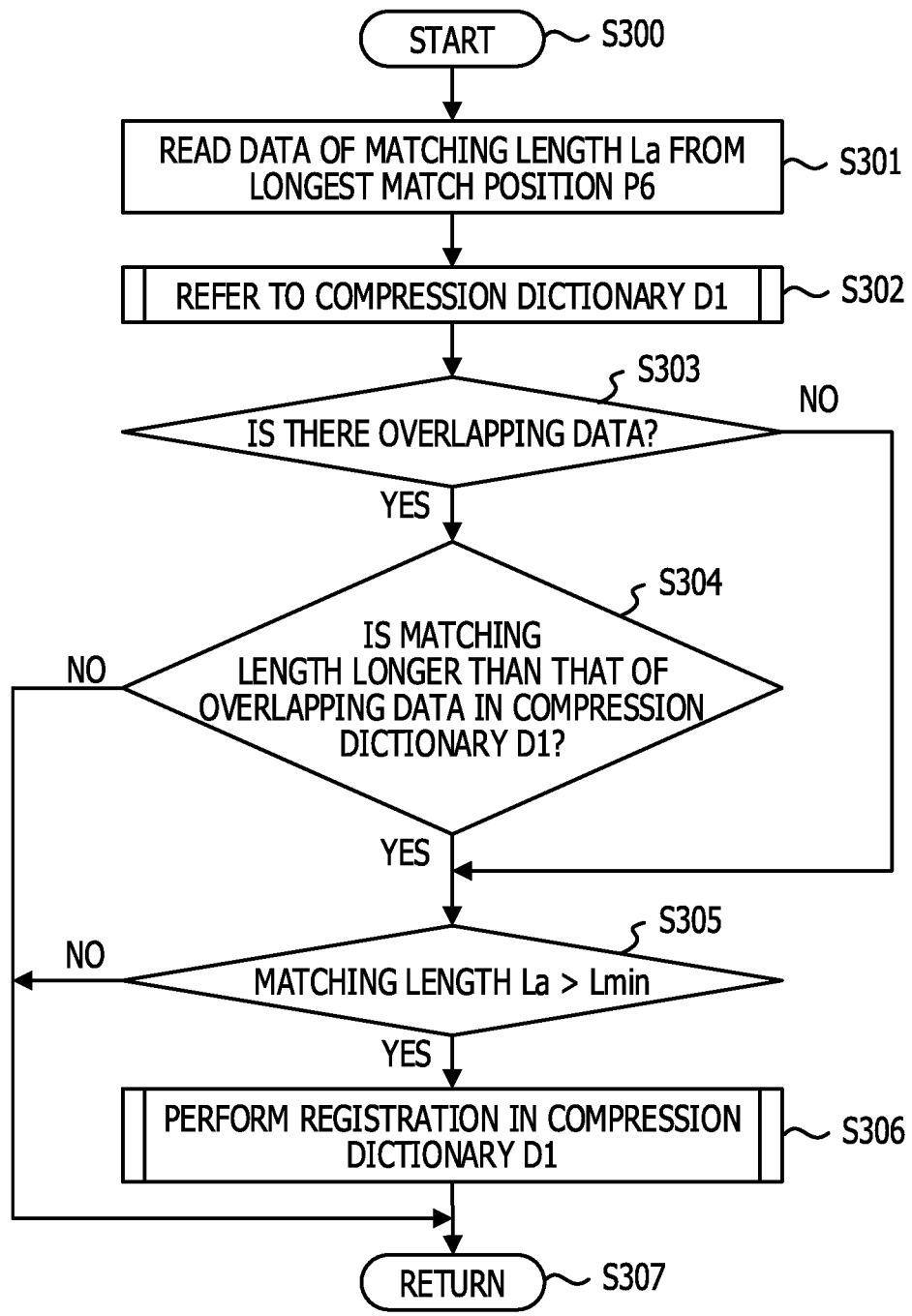
FIG. 10 illustrates an exemplary procedure for processing of updating the compression dictionary.

FIG. 10 illustrates an exemplary procedure of the processing of updating the compression dictionary. If the updating processing is instructed by the control unit 111 (S300), the updating unit 115 reads data from the storage region A2 based on the matching length La and the longest match position Pa that are designated by the control unit 111 (S301). That is, the updating unit 115 reads the data about the matching length La from the longest match position Pa in the storage region A2. The data that has been read in S301 is data as a target of registration in the compression dictionary (registration target data).

The updating unit 115 causes the reference unit 114 to refer to the compression dictionary based on the registration target data (S302). The updating unit 115 determines whether or not data that overlaps the registration target data is included in the compression dictionary based on the result of the reference processing in S302 (S303). If data that overlaps the registration target data is present in the compression dictionary (S303: YES), the updating unit 115 determines whether or not the matching length of the registration target data is longer than that of the overlapping data in the compression dictionary (S304). A case in which the data which includes the part of the overlapping data has been registered in the compression dictionary, for example, means that longer data than the registration target data has been registered, and a determination result "NO" is obtained in the determination in S304.

If overlapping data is not included in S303 (S303: NO), or the matching length of the registration target data is longer than that of the overlapping data in S304 (S304: YES), the updating unit 115 determines whether or not the matching length La is greater than the set value Lmin (S305). If it is determined in S305 that the matching length is greater than the set value Lmin (S305: YES), the updating unit 115 performs the processing of registering the registration target data in the compression dictionary (S306) and completes the processing (S307). Since the procedure for the processing of registering the registration target data in the compression dictionary in S306 differs depending on a form of the compression dictionary, a further description will be given in accordance with different forms of the compression dictionary.

If the matching length of the registration target data is longer than that of the overlapping data in S304 (S304: YES), or the matching length La is equal to or less than the set value Lmin (S304: NO), the updating unit 115 completes the processing (S307) without performing S306.

In FIGS. 10, S303 and S304 are additional configurations, and the updating unit 115 may perform the processing in S305 if the registration target data completely coincides with the data that has already been registered in the compression dictionary. In addition, the processing in S305 is also an additional configuration, and the updating unit 115 may perform the processing in S306 without performing the determination in S305.

If the updating unit 115 completes the procedure in FIG. 10, the control unit 111 causes the updating unit 113 to update the storage region A2 (S107). The updating unit 113 performs the processing of updating the storage region A2 in response to the instruction from the control unit 111.

Figure 11:
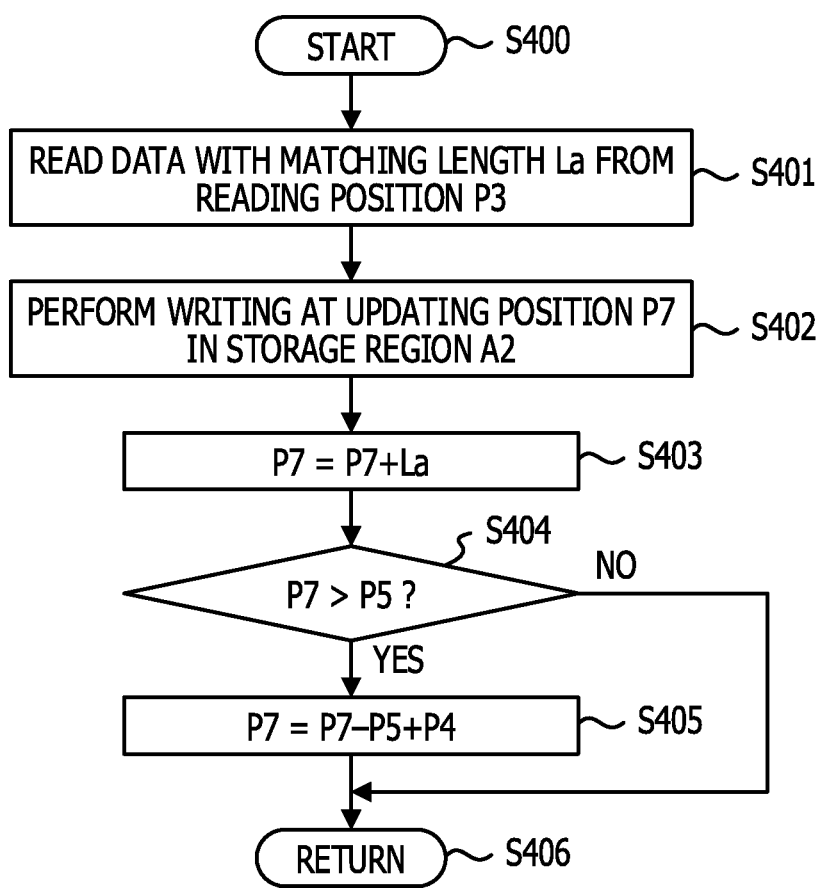
FIG. 11 illustrates an exemplary procedure for processing of updating the storage region A2.

FIG. 11 illustrates an exemplary procedure for the processing of updating the storage region A2. If the instruction for the processing of updating the storage region A2 is received from the control unit 111 (S400), the updating unit 113 reads the data with the matching length La from the reading position P3 in the storage region A1 (S401). Furthermore, the updating unit 113 writes the data, which has been read in S401, at the updating position P7 in the storage region A2 (S402). In the writing in S402, data that exceeds the end position P5 in the storage region A2 is written from the start position P4 in the storage region A2.

Then, the updating unit 113 updates the updating position P7 (S403). As for the initial value of the updating position P7, the updating position P7 is updated to P7+La since the data with the matching length La has been written in the storage region A2 in S402. "=" in S403 in FIG. 11 is an assignment operator. Furthermore, the updating unit 113 determines whether or not the updating position P7 is greater than the end position P5 (S404), and if the updating position P7 is greater than the end position P5 (S404: YES), the updating unit 113 corrects the updating position P7 to P7=P7−P5+P4 (S405). "=" in S405 is an assignment operator. If the processing in S405 has been performed, or the updating position P7 is not greater than the end position (S404: NO), the updating unit 113 completes the processing (S406).

If the updating unit 113 completes the procedure in FIG. 11, the control unit 111 writes, at the writing position P10, the compressed code that has been generated in accordance with the result of the processing of referring to the compression dictionary in S104 or the data at the reading position P3 in the storage region A1 (S108). At P108, the control unit 111 further updates the writing position P10 in accordance with the length of the written data (the compressed code or the data at the reading position P3). If S108 has been completed, the control unit 111 updates the reading position P3 (S109). Furthermore, the control unit 111 determines whether or not the reading position P3 corresponds to the end point (end position P2) of the file F1 (S110). If the reading position P3 has not yet reached the end position P2 (S110: NO), the control unit 111 performs the processing in S104 again. If the reading position P3 has reached the end position P2 (S110: YES), the control unit 111 generates a compressed file including the data that has been written in the storage region A4 and the compression dictionary and performs file closing processing (S111). If the compressed file has been generated in S111, the control unit 111 provides information, which indicates that the compression process has been completed, to a source that calls for the compression function and completes the processing.

Figure 12:
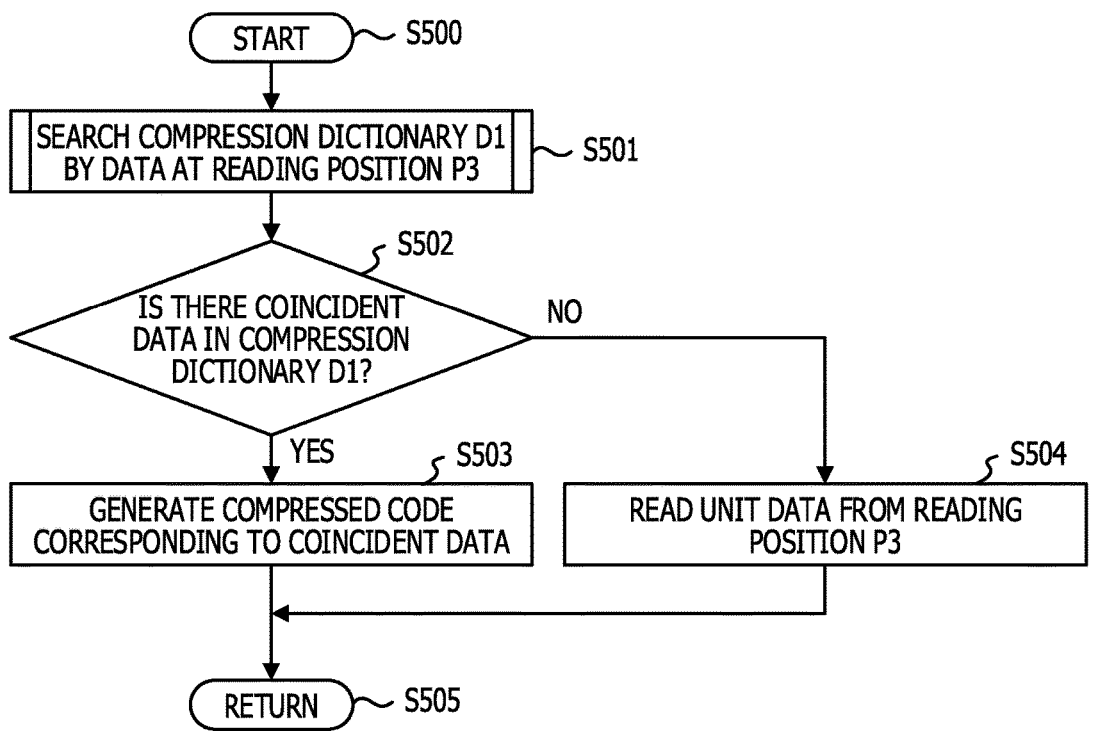
FIG. 12 illustrates an exemplary procedure for processing of referring to the compression dictionary.

Next, a description will be given of reference processing in S104 illustrated in FIG. 7. FIG. 12 illustrates an exemplary procedure for processing of referring to the compression dictionary. If the control unit 111 provides an instruction for reference processing (S500), the reference unit 114 searches in the compression dictionary based on the data (the data as a target of processing) starting from the reading position P3 (S501). S501 will be described later along with the forms of the compression dictionary. Next, the reference unit 114 determines whether or not data (coincident data) that coincides with the data as a target of processing is present in the compression dictionary based on the result of the search in the compression dictionary in S501 (S502). If coincident data is present in the compression dictionary (S502: YES), the reference unit 114 generates a compressed code that corresponds to the coincident data (S503).

If coincident data is not present in the compression dictionary (S502: NO), the reference unit 114 reads data from the reading position P3 in the storage region A1 (S504). The data that is read in S504 is information about a unit of characters, for example. The unit is a counter value i that is used in FIG. 9 or a unit that is used for the reference position P6 and has the same data amount as an amount of increase incremented in S204 or S211.

Furthermore, the reference unit 114 applies an identifier in the processing in S503 or S504. The identifier indicates whether or not the target with the identifier applied thereto is a compressed code, and further indicates a type and the like of the compressed code. The identifier will be described later in detail along with specific examples of the compression dictionary.

If the processing in S503 or S504 is completed, the reference unit 114 returns, to the control unit 111, the compressed code that has been generated in S503 or the data that has been read in S504 and completes the processing (S505).

Next, a description will be given of the compression process for the respective exemplary compression dictionaries.

FIG. 13 illustrates a compression dictionary table T2. The compression dictionary table T2 is an example of the compression dictionary. The compression dictionary table T2 includes columns of data (character information). In addition, a data region with a fixed length (m bits, for example) is secured for data (character information), and a number that indicates the order of data in the compression dictionary table T2 is used as a compressed code. Since "horse" is present at the position of m×1, for example, a code (registration number) with a fixed length such as "00000001" is used as a compressed code. According to a modification example, columns for compressed codes may be provided, and registration numbers may be stored in the columns of the compressed codes. According to another modification example, compressed codes with variable lengths, which are generated in accordance with a predetermined algorithm, may be stored in the columns of the compressed codes.

By the processing in S306 illustrated in FIG. 10, a record including a set of data and a compressed code is registered. The registered data is data with the longest match which is determined by the reference processing in S105 in FIG. 7. Although FIG. 13 illustrates examples such as words, phrases, and tags, character information or the like as a part of a word is also registered in the compression dictionary table T2. Although character information is exemplified as the data that is registered in the compression dictionary table T2, the data is not limited to character information.

The compression dictionary table T2 illustrated in FIG. 13 is accessed in the processing in S302 and the processing in S306 illustrated in FIG. 10 and the processing in S501 illustrated in FIG. 12. The compression dictionary table T2 is accessed by using the position information in the storage unit 13. The position information of the compression dictionary table T2 includes a start position P11, an end position P12, a reference position P13, and an updating position P14.

Figure 14:
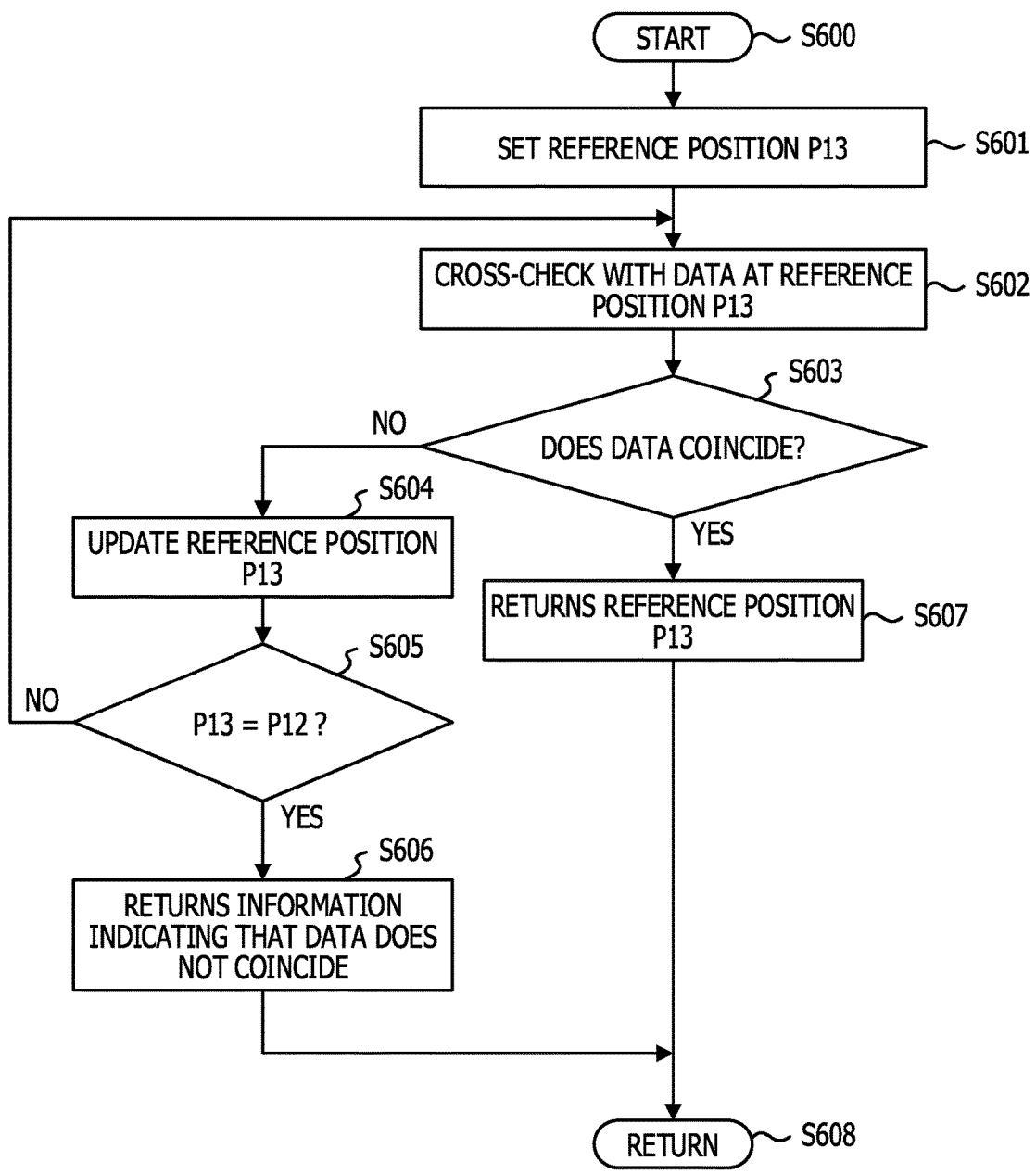
FIG. 14 illustrates an exemplary procedure for processing of referring to the compression dictionary table T2.

FIG. 14 illustrates an exemplary procedure for the processing of referring to the compression dictionary table T2. The processing of referring to the compression dictionary table T2 is performed in the processing in S302 illustrated in FIG. 10 or the processing in S501 illustrated in FIG. 12, for example. If an instruction for the reference processing is received (S600), the reference unit 114 sets the reference position P13 to the start position P11 first (S601). Then, the reference unit 114 cross-checks the data as a target with the data in the record that is represented at the reference position P13 (S602). The data as a target is registration target data in the processing in S302 illustrated in FIG. 10, and a data string that is read from the reading position P3 in the processing in S501 illustrated in FIG. 12. The reference unit 114 determines, as a result of the cross-checking in S602, whether or not the data as a target coincides with the data in the record (S603).

If the data as a target does not coincide with the data in the record as a result of the cross-checking in S602 (S603: NO), the reference unit 114 updates the reference position P13 (S604). For example, the reference position P13 after the updating indicates a record following the record that is represented at the reference position P13 before the updating. Furthermore, the reference unit 114 determines whether or not the reference position P13 has reached the end position P12 (S605). If the reference position P13 has not reached the end position P12 (S605: NO), the reference unit 114 performs the cross-checking processing in S602 again. If the reference position P13 has reached the end position P12 (S605: YES), the reference unit 114 returns, to the control unit 111, information indicating that data which coincides with the data as a target is not present in the compression dictionary table T2 (S606).

If the data as a target coincides with the data in the record as a result of the cross-checking in S602 (S603: YES), the reference unit 114 returns the reference position P13 to the control unit 111 (S607). The reference unit 114 performs the processing in S607 or S606 and then completes the reference processing (S608).

The reference unit 114 generates an identifier in accordance with the result of the reference processing in FIG. 14. If information indicating that the data as a target does not coincide with the data in the record is returned in the processing in S606, the reference unit 114 applies an identifier "0", for example, to unit data in the processing in S504 illustrated in FIG. 12. If the reference position P13 is returned in S607, the reference unit 114 applies an identifier "1", for example, to the compressed code in the processing in S503 illustrated in FIG. 12. In the decompression, whether to refer to the compression dictionary table T2 is determined based on the identifier.

Figure 15:
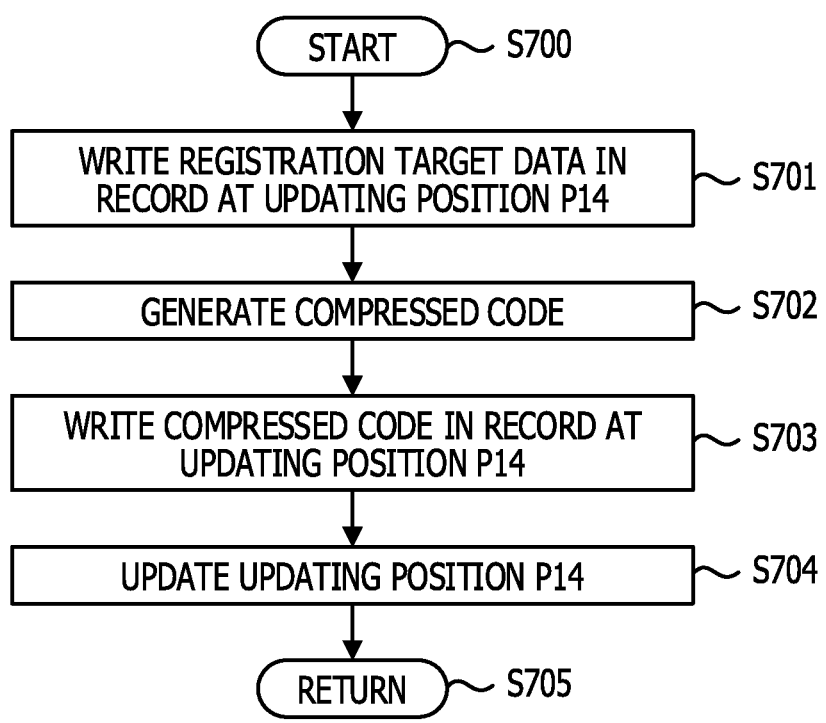
FIG. 15 illustrates an exemplary procedure for processing of updating the compression dictionary table T2.

FIG. 15 illustrates an exemplary procedure for processing of updating the compression dictionary table T2. The processing of updating the compression dictionary table T2 is performed in the processing in S306 illustrated in FIG. 10, for example. If an instruction for the updating processing is received (S700), the updating unit 115 writes the registration target data in the record at the updating position P14 (S701). The registration target data is data that is read in S301 in FIG. 10.

If the data is registered in the record at the updating position P14 in S701, the updating unit 115 generates a compressed code (S702). As described above, the compressed data corresponding to the respective data is a registration number that indicates an order in which the respective data has been registered, for example. The updating unit 115 writes the compressed code that is generated in S702 in the record at the updating position P14 (S703). The processing in S703 is processing that is performed in a case where columns for the compressed codes are provided in the compression dictionary table T2 and is not performed in a case where the position of the record is used as a compressed code. Furthermore, the updating unit 115 updates the updating position P14 (S704) and completes the updating processing (S705). The updating of the updating position P14 is performed in the same manner as the updating of the reference position. That is, the record that is represented by the updating position P14 after the updating is a record following the record that is represented at the updating position P14 before the updating.

Since the compression dictionary (compression dictionary table T2) in the aforementioned example has a table structure, searching in the table is performed based on a compressed code for the decompression. Since it is possible to read only desired information from the compression dictionary table T2 if the information that indicates a position in the compression dictionary table T2 is a compressed code, the speed of the searching in the compression dictionary table T2 increases.

Figure 16:
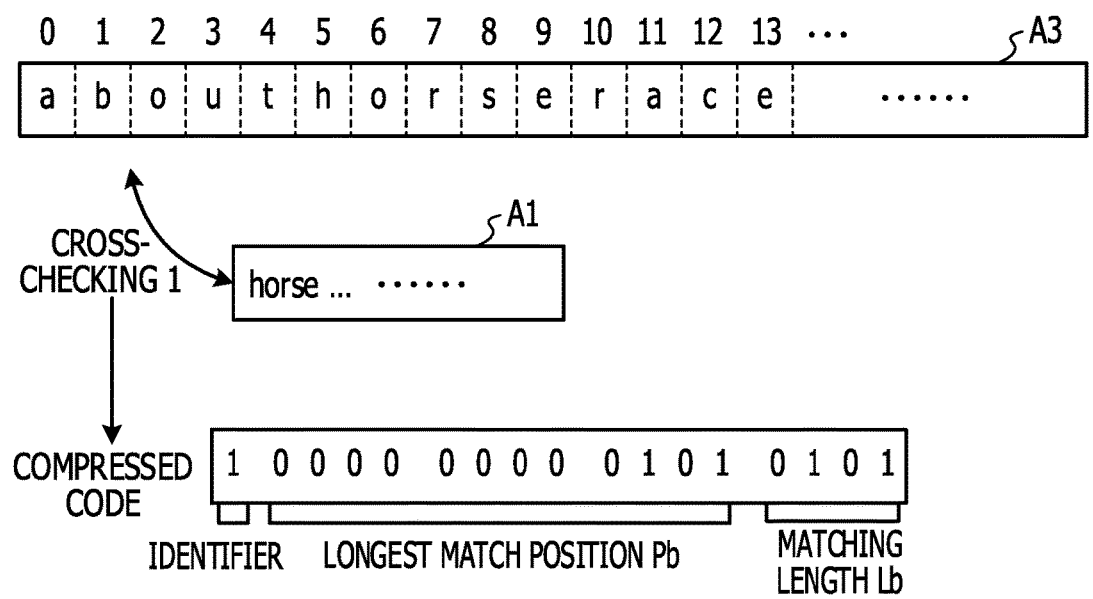
FIG. 16 illustrates an overview of processing using a compression dictionary D1.

FIG. 16 illustrates an overview of processing using a compression dictionary D1. A description will be given of the compression dictionary D1 exemplified in FIG. 1.

In the processing in S306 illustrated in FIG. 10, the registration target data is sequentially stored on the storage region A3. If registration target data "about", "horse", and "race" is sequentially acquired by referring to the storage region A2, for example, "about" is stored at the storage positions "0" to "4", and furthermore, "horse" is stored from "5" following the storage position "4".

In a case of performing the processing of the cross-checking 1 illustrated in FIG. 1 (the processing in S501 in FIG. 12, for example), the reference unit 114 cross-checks the data from the reading position P3 of the storage region A1 with the respective data that is registered in the storage region A3. The cross-checking unit 114 extracts data with the longest match in the storage region A3 by the cross-checking 1 and uses the storage position (longest match position Pb) of the data in the storage region A3 and the matching length Lb as a compressed code. In the example in FIG. 16, the data string from the reading position P3 of the storage region A1 is "horse . . . ". If the storage positions "5" to "9" of the storage region A3 corresponds to the longest match in such a case, the compressed code is indicated by the longest match position Pb "000000000101 (binary number representation)" and the matching length Lb "0101 (binary number representation)", for example. Furthermore, an identifier "1" that indicates a compressed code is applied. If the data at the reading position P3 itself is used instead of the compressed code, an identifier "0" is applied. In the example illustrated in FIG. 16, the compressed code corresponds to 17 bits. If a character code system used for the character information "horse" is assumed to be an 8-bit character code system, 40 bits are used. Therefore, the data amount is suppressed to half or less in this example.

For example, the data length of the address in the storage region A3 is determined in advance. In addition, the storage region A3 also has a data size corresponding to the data length of the address. Since the address is represented by 12 bits and a character code that is represented by 1 byte is used in the aforementioned example, the data size of the storage region A3 is approximately 4 KB.

Figure 17:
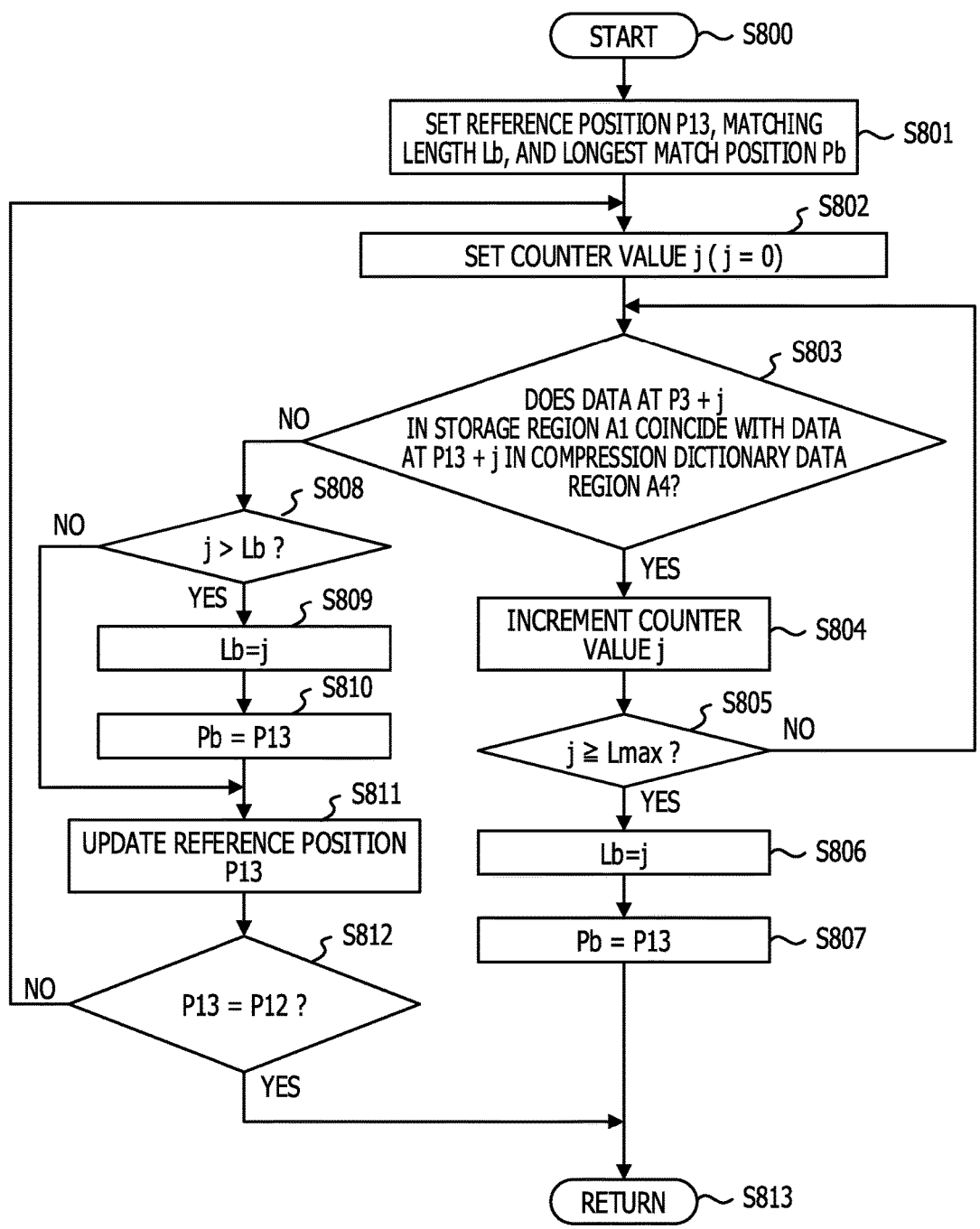
FIG. 17 illustrates an exemplary procedure for processing of referring to the compression dictionary D1.

FIG. 17 illustrates an exemplary procedure for processing of referring to the compression dictionary D1. If the processing in S501 illustrated in FIG. 12 is started (S800), the reference unit 114 sets initial values of the reference position P13, the matching length Lb, and the longest match position Pb (S801). For example, the initial value of the reference position P13 is set to the start position P11 of the storage region A3. For example, the initial value of the matching length Lb is set to 0. In addition, the initial value of the longest match position Pb is set to the position that is smaller than P11 by one (P11−1), for example. Furthermore, the reference unit 114 sets a counter value j (j=0) (S802).

The reference unit 114 determines whether or not data at a position (P3+j) that deviates from the reading position P3 of the storage region A1 by the counter value j coincides with data at a position (P6+j) that deviates from the reference position P13 of the storage region A3 by the counter value j (S803).

If the reference unit 114 determines in the determination in S803 that the data coincides with each other (S803: YES), the reference unit 114 increments the counter value j (S804). Then, the reference unit 114 determines whether or not the counter value j that is incremented in S804 is equal to or greater than the set value Lmax (S805). If the counter value j is less than the set value Lmax (S805: NO), the determination in S803 is made again. By the aforementioned processing in S803 to S805, determination is made one by one to in order to recognize whether or not a data string R1 from the reading position P3 coincides with a data string from the reference position P13. The counter value j represents the length of data that has been confirmed to coincide with the data string R1. The set value Lmax is a pre-set value and represents an upper limit of the longest match.

If the counter value j is equal to or greater than the set value Lmax in the determination in S805 (S805: YES), the reference unit 112 updates the matching length Lb to the counter value j (S806) and updates the longest match position Pb to the reference position P13 (S807). "=" represented in S806 and S807 in FIG. 17 is an assignment operator. In addition, the order of the processing in S806 and S807 may be reversed. If the values are updated in S806 and S807, the reference unit 114 returns, to the control unit 111, the matching length Lb and the longest match position Pb into which the values are substituted (S813).

If it is determined in the determination in S803 that the data does not coincide with each other (S803: NO), the reference unit 114 determines whether or not the counter value j is greater than the matching length Lb (S808). If the counter value j is greater than the matching length Lb (S808: YES), the reference unit 114 updates the matching length Lb to the counter value j (S809) and updates the longest match position Pb to the reference position P13 (S810). "=" represented in S809 and S810 in FIG. 17 is an assignment operator. In addition, the order of the processing in S809 and S810 may be reversed.

If the counter value j is equal to or less than the matching length Lb (S808: NO) or the processing in S806 and S807 is performed, the reference unit 114 updates the reference position P13 (S811). In S811, the reference position P13 after the updating represents data following the data that is represented at the reference position before the updating. The reference unit 114 further determines whether or not the reference position P13 has reached the end position P2 of the storage region A3 (S812). "=" represented in S812 in FIG. 17 is an equal sign. If the reference position P13 has not reached the end position P12 (S812: NO), the reference unit 114 resets the counter value j by the processing in S802 again and makes the determination in S803 based on the reference position P13 that has been incremented in S811. If it is determined in the determination in S812 that the reference position P13 has reached the end position P12 (S812: YES), the reference unit 114 returns the matching length Lb and the longest match position Pb to the control unit 111 and completes the processing of referring to the compression dictionary D1 (S812).

As illustrated in S502 in FIG. 12, the reference unit 114 determines whether or not the coincident data is present in the compression dictionary D1 in accordance with the result of the reference processing illustrated in FIG. 17. The determination is made in accordance with the longest match position Pb and the matching length Lb. If the matching length Lb is less than a predetermined value (2 bytes or 3 bytes, for example), it may be assumed that coincident data is not present in the compression dictionary D1. If the reference position P13 does not change from the initial value (the start position P11-1 or the like is used as an initial value, for example) even if a predetermined value is set to one, it may be assumed that coincident data is not present in the compression dictionary D1.

In addition, the compression dictionary D1 is referred to in order to determine whether or not data overlapping the registration target data is present, even in the processing in S302 illustrated in FIG. 10. The reference processing is different from the processing in S501 illustrated in FIG. 12, and the length of data to be referred to is determined in advance. For this reason, the updating unit 115 performs the processing of referring to the compression dictionary D1 in accordance with the exemplary procedure illustrated in FIG. 14 instead of the exemplary procedure illustrated in FIG. 17. Hereinafter, a description will be given of the processing of referring to the compression dictionary D1 by the updating unit 115 with reference to FIG. 14.

If an instruction for the processing of referring to the compression dictionary D1 based on the registration target data is received (S600), the updating unit 15 sets the reference position P13 in the compression dictionary D1 (S601). In S601, the updating unit 115 sets the reference position P13 to the start position P11 of the compression dictionary D1 (storage region A3), for example.

Then, the updating unit 115 cross-checks the data that is present at the reference position P13 of the storage region A3 with the registration target data (S602). Furthermore, the updating unit 115 determines whether or not the data coincides with the registration target data in the cross-checking in S602 (S603). If it is determined in S603 that the data does not coincide with each other (S603: NO), the updating unit 115 updates the reference position P13 (S604). The reference position P13 after the updating represents data following the data that is represented at the reference position P13 before the updating. Furthermore, the updating unit 115 determines whether or not the reference position P13 has reached the end position P12 of the storage region A3 (S605). If the reference position P13 has not reached the end position P12 as a result of the determination in S605 (S605: NO), the updating unit 115 performs the processing in S602 again. In contrast, if the reference position 13 has reached the end position P12 in S605 (S605: YES), the updating unit 115 returns, to the control unit 111, information indicating that data which coincides with the registration target data is not present in the compression dictionary D1 (S606).

In contrast, if it is determined in S603 that the data coincides with each other (S603: YES), the updating unit 115 returns the reference position P13 to the control unit 111 (S607). If S606 or S607 is completed, the updating unit 115 completes the processing (S608).

Figure 18:
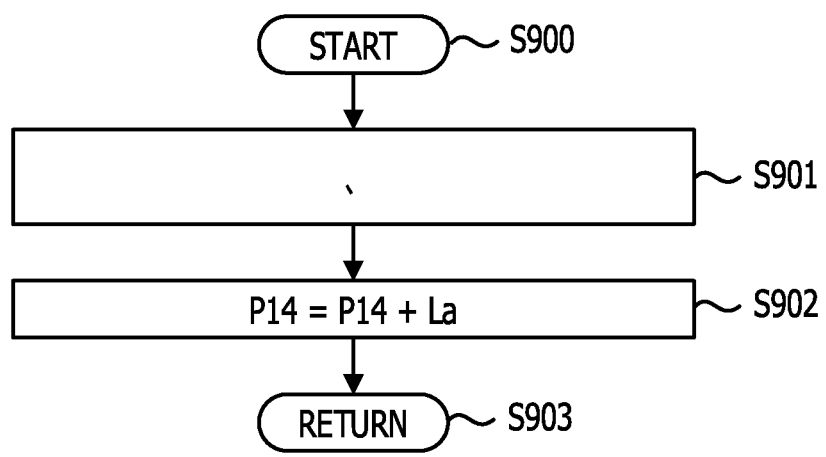
FIG. 18 illustrates an exemplary procedure for processing of registering registration target data.

FIG. 18 illustrates an exemplary procedure for processing of registering the registration target data in the compression dictionary D1. If the registration processing is started in S306 illustrated in FIG. 10 (S900), the updating unit 115 writes the registration target data from the updating position P14 of the compression dictionary D1 (storage region A3) (S901). Next, the updating unit 115 updates the updating position P14 (S902). The updating position P14 moves by the length (matching length La) of the registration target data. If S902 is completed, the updating unit 115 completes the registration processing (S903). For example, the initial value of the updating position P14 is P11, and the updating position P14 is updated every time the registration processing in FIG. 18 is performed.

In the aforementioned case in which the compression dictionary D1 is used, the compressed code itself is not included in the compression dictionary D1. For this reason, the data size of the compression dictionary D1 itself is suppressed.

An overview of the processing using the reference table T3 is illustrated in FIG. 2 as described above. The storage region A3 and the reference table T3 illustrated in FIG. 2 are used as the compression dictionary D2.

The reference table T3 includes a plurality of records, and each record includes a pair of a storage position in the storage region A3 and a data length. For example, each record in the reference table T3 includes a pair of the storage position and the data length of the respective registration target data that is registered in the storage region A3. For example, information indicating positions (a start position P15, an end position P16, a reference position P17, and a writing position P18) of the reference table T3 in the storage unit 13 is managed in the storage unit 13 by the same table as the position information table T1 illustrated in FIG. 8.

In the compression dictionary D1 illustrated in FIG. 16, the compressed code is generated by the longest match position Pb and the matching length Lb in the case in which the longest match position Pb and the matching length Lb are acquired. In the compression dictionary D2, the reference table T3 is searched based on the longest match position Pb and the matching length Lb that are acquired by the reference processing illustrated in FIG. 17, and a registration number (pointer) indicating the record that includes the corresponding storage position and the data length is used as a compressed code. In such a case, an identifier "1" that indicates a compressed code acquired by referring to the storage region A3 is used as illustrated in FIG. 2.

In addition, there may be a case in which a record including the corresponding storage position and the data length is not present regardless of that the longest match position Pb and the matching length Lb which are acquired by the reference processing illustrated in FIG. 17. In such a case, Huffman coding, for example, is performed on the data as a target of processing, and an identifier "0" is applied to the generated Huffman code.

Even in the case in which the compression dictionary D2 illustrated in FIG. 2 is used as described above, the reference processing illustrated in FIG. 17 is performed. The reference unit 114 performs the processing of referring to the reference table T3 based on the longest match position Pb and the matching length Lb that are acquired by the reference processing illustrated in FIG. 17. In doing so, the reference unit 114 acquires the pointer in the reference table T3.

Figure 19:
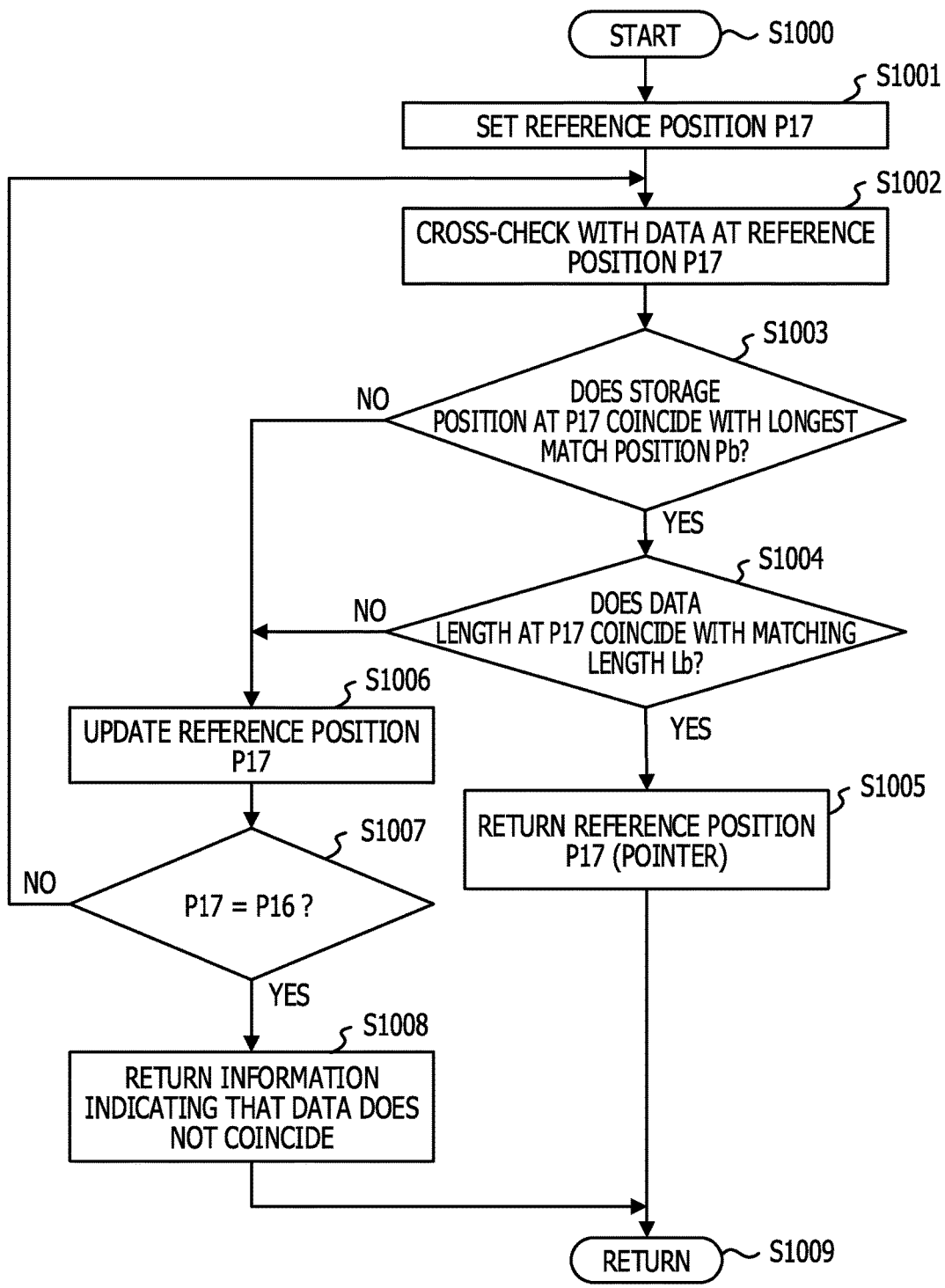
FIG. 19 illustrates an exemplary procedure for processing of referring to a reference table T3.

FIG. 19 illustrates an exemplary procedure for the processing of referring to the reference table T3. If the processing in S813 is performed in the reference processing in FIG. 17 (S1000), the reference unit 114 sets an initial value of the reference position P17 (S1001). The initial value of the reference position P17 is a start position P15 of the reference table T3, for example. Next, the reference unit 114 performs processing of matching the longest match position Pb and the matching length Lb with the record at the reference position P17 in the reference table T3 (S1002).

The reference unit 114 determines whether or not the storage position that is stored on the record at the reference position P17 coincides with the longest match position Pb as a result of the cross-checking processing in S1002 (S1003). Furthermore, if the storage position that is stored on the record at the reference position P17 coincides with the longest match position Pb (S1003: YES), the reference unit 114 further determines whether or not the data length that is stored on the record at the reference position P17 coincides with the matching length Lb (S1004). If the data length that is stored on the record at the reference position P17 coincides with the matching length Lb (S1004: YES), the reference unit 114 returns the reference position P17 to the control unit 111 (S1005). In such a case, the compressed code is generated based on the reference position P17 (the registration number illustrated in FIG. 2).

If any of the storage position and the data length that are stored on the record at the reference position P17 do not coincide with each other (S1003, S1004: NO), the updating unit 114 updates the reference position P17 (S1006). The updating unit 114 increments the value that is represented at the reference position P17 and sets a value that indicates the next record. Furthermore, the reference unit 114 determines whether or not the reference position P17 has reached the end position P16 of the reference table T3 (S1007). "=" represented in S1007 is an equal sign.

If the reference position P17 has not reached the end position P16 (S1007: NO), the reference unit 114 performs the processing in S1002. In contrast, if the reference position P17 has reached the end position P16 (S1007: YES), the reference unit 114 returns, to the control unit 111, information indicating that coincident record is not present (S1008).

If S1005 or S1008 is executed, the reference unit 114 then completes the processing of referring to the reference table T3 and returns to the flow illustrated in FIG. 12.

Figure 20:
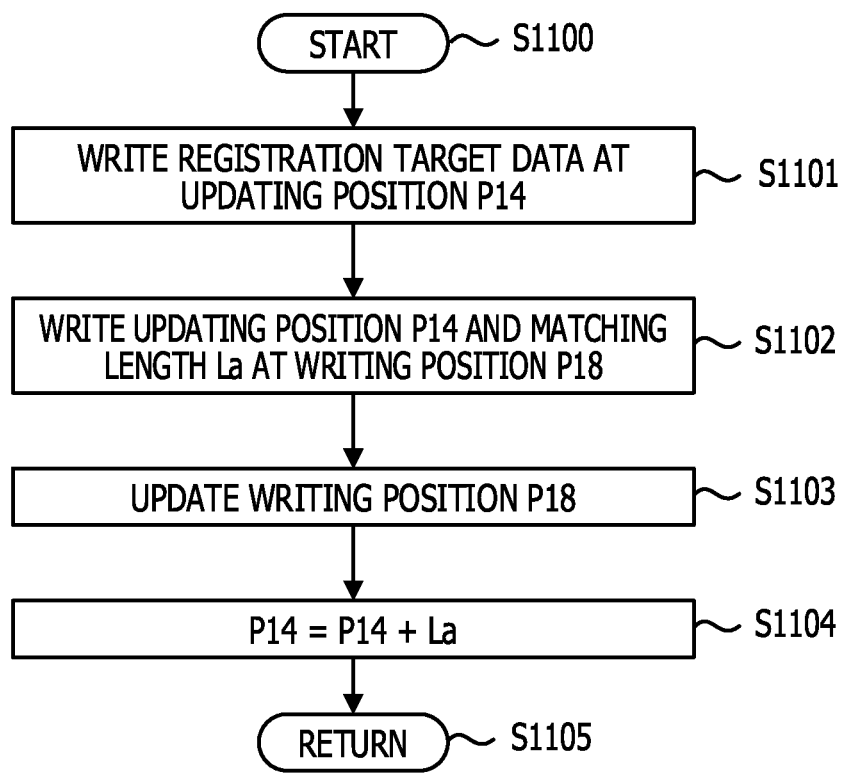
FIG. 20 illustrates an exemplary procedure for processing of registering registration target data.

FIG. 20 illustrates an exemplary procedure for processing of registering registration target data. The registration processing in the case of using the compression dictionary D1 and the registration processing in the case of using the compression dictionary D2 partially include the same procedure. If the registration processing is started in S306 illustrated in FIG. 10 (S1100), the updating unit 115 writes the registration target data from the updating position P14 of the storage region A3 (S1101). Next, the updating unit 115 writes the updating position P14 and the matching length La in the record at the writing position P18 of the reference table T3 (S1102). The updating unit 115 writes the updating position P14 at the storage position of the record at the writing position P18 and writes the matching length La as the data length. Then, the updating unit 115 updates the writing position P18 (S1103). The writing position P18 after the updating represents the record following the record that is represented at the writing position P18 before the updating. The initial value of the writing position P18 corresponds to the start position P15, for example, and the writing position P18 is updated every time the registration processing in FIG. 20 is performed.

Next, the updating unit 115 updates the updating position P14 (S1104). The updating position P14 moves by the length (matching length La) of the registration target data. If S1104 is completed, the updating unit 115 completes the registration processing (S1105). For example, the initial value of the updating position P14 corresponds to P11, and the updating position P14 is updated every time the registration processing in FIG. 20 is performed.

In the aforementioned case in which the compression dictionary D2 is used, the compressed code is summarized in the registration number. Therefore, it is possible to expect to improve a compression rate as compared with the case of using the compressed code based on the longest match position Pb and the matching length Lb. In contrast, since the longest match position Pb and the position corresponding to the matching length Lb are represented by the compressed code, and the position of the data to be decompressed is represented by the longest match position Pb and the matching length Lb, the search by the cross-check with the data in the compression dictionary D1 is not included. Therefore, the decompression speed hardly deteriorates.

Hereinafter, hardware and software used in the embodiment will be described.

Figure 21:
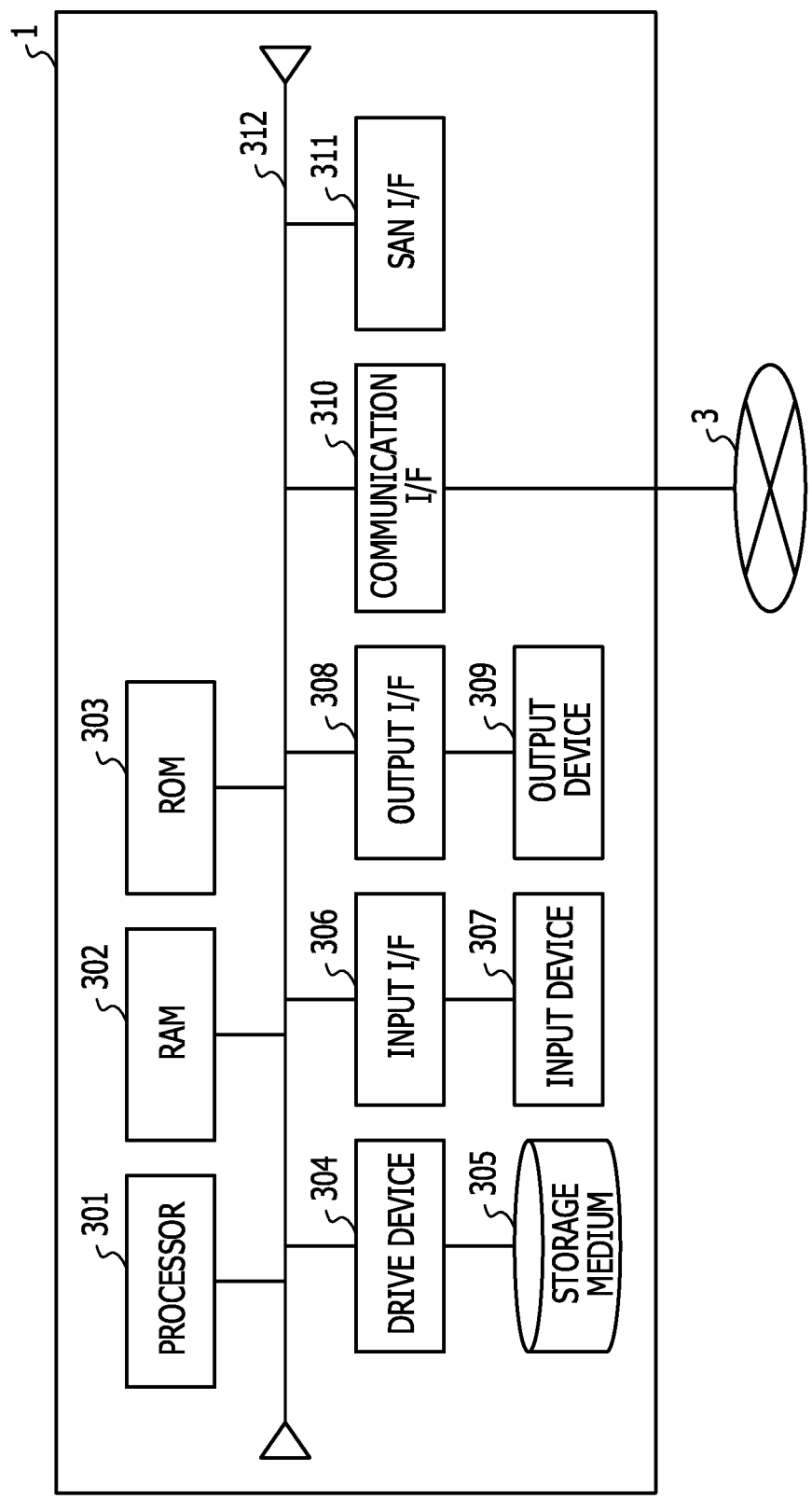
FIG. 21 illustrates an exemplary hardware configuration of a computer.

FIG. 21 is a diagram illustrating an exemplary hardware configuration of the computer 1. The computer 1 includes, for example, a processor 301, a random access memory (RAM) 302, a read-only memory (ROM) 303, a drive device 304, a storage medium 305, an input interface (I/F) 306, an input device 307, an output interface (I/F) 308, an output device 309, a communication interface (I/F) 310, a storage area network (SAN) interface (I/F) 311, and a bus 312. Each hardware is connected via the bus 312.

The RAM 302 is a memory device capable of executing reading and writing. For example, semiconductor memory such as a static RAM (SRAM) or a dynamic RAM (DRAM) or a flash memory rather than a RAM is used. The ROM 303 includes a programmable ROM (PROM). The drive device 304 is a device that executes at least one of reading and writing of information recorded on the storage medium 305. The storage medium 305 stores information written by the drive device 304. The storage medium 305 is, for example, a storage medium such as a hard disk, a flash memory such as a solid state drive (SSD), a compact disc (CD), a digital versatile disc (DVD), or a Blu-ray disc. For example, the computer 1 includes the drive device 304 and the storage medium 305 in regard to a plurality of kinds of storage media.

The input interface 306 is a circuit that is connected to the input device 307 and delivers an input signal received from the input device 307 to the processor 301. The output interface 308 is a circuit that is connected to the output device 309 and causes the output device 309 to execute output according to an instruction from the processor 301. The communication interface 310 is a circuit that controls communication via the network 3. The communication interface 310 is, for example, a network interface card (NIC). The SAN interface 311 is a circuit that controls communication with a storage device connected to the computer 1 via a storage area network. The SAN interface 311 is, for example, a host bus adapter (HBA).

The input device 307 is a device that transmits an input signal according to an operation. The input device 307 is, for example, a key device such as a button mounted on a keyboard or the body of the computer 1 or a pointing device such as a mouse or a touch panel. The output device 309 is a device that outputs information according to control of the computer 1. The output device 309 is, for example, an image output device (display device) such as a display or an audio output device such as a speaker. For example, an input/output device such as a touch screen is used as the input device 307 and the output device 309. The input device 307 and the output device 309 may be integrated with the computer 1 or may be, for example, devices connected externally to the computer 1 without being included in the computer 1.

For example, the processor 301 reads a program stored in the ROM 303 or the storage medium 305 to the RAM 302 and executes a process of the compression unit 11 or a process of the decompression unit 12 according to an order of the read program. At this time, the RAM 302 is used as a work area of the processor 301. The function of the storage unit 13 is realized when the ROM 303 and the storage medium 305 store program files (an application program 24, a middleware 23, and an OS 22 to be described below) and data files (the compression target file F1, the compressed file F2, and the like) and the RAM 302 is used as a work area of the processor 301. The program read by the processor 301 will be described with reference to FIG. 22.

Figure 22:
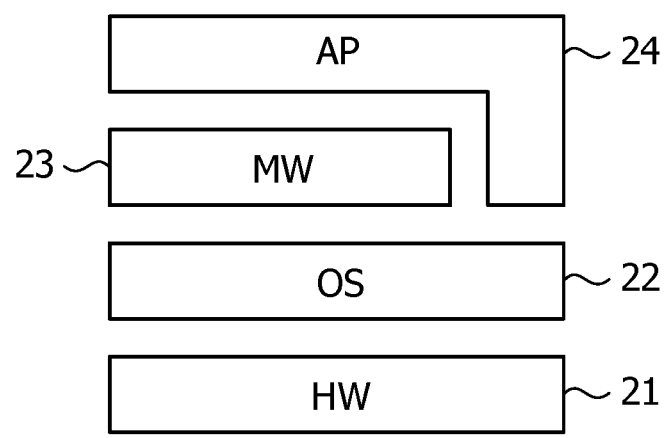
FIG. 22 illustrates an exemplary configuration of a program that is operated in the computer.

FIG. 22 is a diagram illustrating an example of the configuration of a program operating in the computer 1. In the computer 1, an operating system (OS) 22 controlling a hardware group 21 (301 to 312) illustrated in FIG. 21 operates. The processor 301 operates in the order according to the OS 22 to control and manage the hardware group 21 so that a process according to the application program 24 or the middleware 23 is realized by the hardware group 21. In the computer 1, the middleware 23 or the application program 24 is read to the RAM 302 and is executed by the processor 301.

When the compression function is called, the processor 301 executes a process based on at least a part of the middleware 23 or the application program 24 (executes the process by controlling the hardware group 21 based on the OS 22) so that the function of the compression unit 11 is realized. When the decompression function is called, the processor 301 executes a process based on at least a part of the middleware 23 or the application program 24 (executes the process by controlling the hardware group 21 based on the OS 22) so that the function of the decompression unit 12 is realized. The compression function and the decompression function may be each included in the application program 24 or may be a part of the middleware 23 called to be executed according to the application program 24.

The compressed file F2 that is acquired by the compression function of an application program 24 (or a middleware 23) may be partially decompressed based on the compression dictionary D1 in the compressed file F2. In a case of partially decompressing a middle part in the compressed file F2, the processing of decompressing the compressed data from the head of the compressed file F2 to the part as a target of decompression is suppressed. Therefore, a burden on the processor 301 is suppressed. In addition, since the compressed data as a target of decompression is partially loaded on the RAM 302, the size of work area is also reduced.

Figure 23:
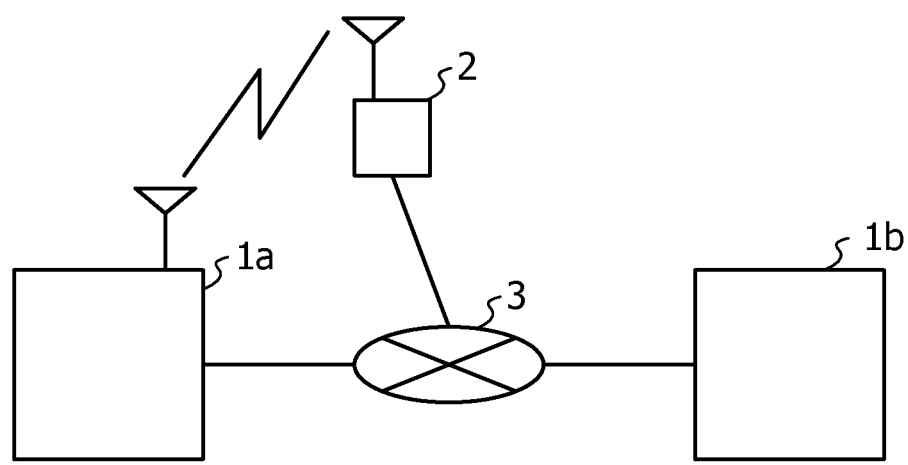
FIG. 23 illustrates an exemplary configuration of an apparatus in a system according to an embodiment.

FIG. 23 is a diagram illustrating an example of the configuration of apparatuses in a system according to the embodiment. The system in FIG. 23 includes a computer 1a, a computer 1b, a base station 2, and a network 3. The computer 1a is connected to the network 3 connected to the computer 1b in at least one of wireless and wired manners.

The compression unit 11 and the decompression unit 12 illustrated in FIG. 6 may be included in one of the computers 1a and 1b illustrated in FIG. 23. The computer 1b may include the compression unit 11 and the computer 1a may include the decompression unit 12. The computer 1a may include the compression unit 11 and the computer 1b may include the decompression unit 12. Both of the computers 1a and 1b may include the compression unit 11 and the decompression unit 12.

In the compression process according to the embodiment, a processing time taken to execute the compression process is reduced. In the compression process according to the embodiment, the matching determination is executed again with the data in the storage region in which only the data string determined to be the longest matching data string is stored. Therefore, this advantage may be further obtained when a file is a file (for example, an address book) in which the same data string is used repeatedly.

A compression processing target may be a monitoring message output from the system as well as the data in the file. For example, processes of compressing monitoring messages stored sequentially in a buffer through the above-described compression process and storing the compressed messages as a log file are executed. For example, compression may be executed in units of pages in a database or compression may be executed in units in which a plurality of pages are organized.

The data to be subjected to the above-described compression process is not limited to character information described above. The data to be subjected to the compression process may be information with only numerical values and the above-described compression process may be used for data such as images or audio. For example, since a file considerably including data obtained through audio synthesis considerably includes repetitions in data, a compression ratio is expected to be improved by a dynamic dictionary. It is a matter of course that in a case of using a part thereof, an excessive decompression process is suppressed by the partial decompression. A moving image photographed by a fixed camera also includes many repetitions since images of respective frames are similar. Therefore, it is possible to obtain the same advantages as those of document data or audio data by applying the above-described compression process.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory storage medium having stored therein a program for causing a computer to execute a process, the process comprising:
   first setting a first storage region and a second storage region in a memory;
   first comparing a compression target data in a file with data in the first storage region;
   first creating a first compression code of the compression target data using an identifier indicating the data in the first storage region when a predetermined first consistency between the compression target data and the data in the first storage region is detected;

second comparing the compression target data with data in the second storage region when the predetermined first consistency between the compression target data and the data in the first storage region is not detected, the compression target data being moved to the second storage region after the second comparing;

first storing the compression target data into the first storage region associated with an identifier indicating the data in the first storage region when a predetermined second consistency between the compression target data and the data in the second storage region is detected;

second creating a second compression code of the compression target data using the identifier when the compression target data is stored based on the first storing; and third creating a third compression code of the compression target data based on a different type of coding process than a coding process of the first compression code and the second compression code when the predetermined second consistency between the compression target data and the data in the second storage region is not detected based on the second comparing.

2. The non-transitory storage medium according to claim 1, wherein
the second comparing compares the compression target data with the data in the second storage region for a predetermined data unit, and
the third creating creates the third compression code based on the compression target data with the data unit.

3. The non-transitory storage medium according to claim 1, wherein
the predetermined second consistency indicates that a data size of longest matching data between the compression target data and the data in the second storage region is greater than a predetermined second size.

4. The non-transitory storage medium according to claim 1, wherein
the first compression code and the second compression code include identification information indicating being created based on the identifier.

5. A non-transitory storage medium having stored therein a program for causing a computer to execute a process, the process comprising:
first setting a first storage region and a second storage region in a memory;
first comparing a compression target data in a file with data in the first storage region;
first creating a first compression code of the compression target data using an identifier indicating the data in the first storage region when a predetermined first consistency between the compression target data and the data in the first storage region is detected;
second comparing the compression target data with data in the second storage region when the predetermined first consistency between the compression target data and the data in the first storage region is not detected, the compression target data being moved to the second storage region after the second comparing;
first storing the compression target data into the first storage region associated with an identifier indicating the data in the first storage region when a predetermined second consistency between the compression target data and the data in the second storage region is detected;

second creating a second compression code of the compression target data using the identifier when the compression target data is stored based on the first storing;
third creating a third compression code of the compression target data based on a different type of coding process than a coding process of the first compression code and the second compression code when the predetermined second consistency between the compression target data and the data in the second storage region is not detected based on the second comparing;
registering position information associated with the identifier in a dictionary when the compression target data is stored based on the first storing, the position information indicating a position with regard to the compression target data in the first storage region; and
fourth creating a compression file based on the first compression code, the second compression code, the third compression code and a dictionary, the dictionary including the data associated with the identifier in the first storage region.

6. The non-transitory storage medium according to claim 5, wherein the process further comprises:
associating a first group of blocks of the file divided according to a predetermined rule with a second group of blocks of the compression file corresponding to the first group of blocks; and
fifth creating correspondence information between the first group of blocks and the second group of blocks based on the associating,
wherein the fourth creating stores the correspondence information into the compression file.

7. The non-transitory storage medium according to claim 6, wherein
the dictionary includes a group of dictionaries corresponding to the first group of blocks, and
the registering registers the position information associated with the identifier in a dictionary of the group of dictionaries corresponding to a block including the compression target data of the first group of blocks.

8. The non-transitory storage medium according to claim 5, wherein the process further comprises:
first reading the dictionary from the compression file;
second reading a compressed data from compression file;
sixth creating a first decompression data based on data in the dictionary according to a first identifier indicated by the first compression code when it is determined that the read compressed data is the first compression code;
seventh creating a second decompression data based on data in the dictionary according to a second identifier indicated by the second compression code when it is determined that the read compressed data is the second compression code; and
eighth creating a third decompression data from the read compressed data based on a decoding process corresponding to the coding process when it is determined that the read compressed data is the third compression code.

9. A non-transitory storage medium having stored therein a program for causing a computer to execute a process, the process comprising:
first reading a dictionary from the compression file;
second reading a compressed data from the compression file, the compression file being created by:
first setting a first storage region and a second storage region in a memory,
first comparing, by a processor, a compression target data in a file with data in the first storage region, first creating, by the processor, a first compression code of the compression target data using an identifier indicating the data in the first storage region when a predetermined first consistency between the compression target data and the data in the first storage region is detected, second comparing, by the processor, the compression target data with data in the second storage region when the predetermined first consistency between the compression target data and the data in the first storage region is not detected, the compression target data being moved to the second storage region after the second comparing, first storing, by the processor, the compression target data into the first storage region associated with an identifier indicating the data in the first storage region when a predetermined second consistency between the compression target data and the data in the second storage region is detected, second creating a second compression code of the compression target data using the identifier when the compression target data is stored based on the first storing, third creating a third compression code of the compression target data based on a different type of coding process than a coding process of the first compression code and the second compression code when the predetermined second consistency between the compression target data and the data in the second storage region is not detected based on the second comparing, and fourth creating the compression file based on the first compression code, the second compression code, the third compression code and the dictionary, the dictionary including the data associated with the identifier in the first storage region;

fifth creating a first decompression data based on data in the dictionary according to a first identifier indicated by the first compression code when it is determined that the read compressed data is the first compression code;

sixth creating a second decompression data based on data in the dictionary according to a second identifier indicated by the second compression code when it is determined that the read compressed data is the second compression code; and seventh creating a third decompression data from the read compressed data based on a decoding process corresponding to the coding process when it is determined that the read compressed data is the third compression code.

10. The non-transitory storage medium according to claim 9, wherein the compressed file is further created by:
- associating a first group of blocks of the file divided according to a predetermined rule with a second group of blocks of the compression file corresponding to the first group of blocks,
- eighth creating correspondence information between the first group of blocks and the second group of blocks based on the associating, and
- second storing the correspondence information into the compression file, the process further comprises:
- receiving a decompression request including range information indicating a range of data in the file;
- specifying one or more blocks corresponding to the range information of the second group of blocks based on the range information and the correspondence information, wherein the fifth creating, the sixth creating and seventh creating are executed only with regard to the compression target data in the specified one or more blocks read by the second reading.

* * * * *